US 8,755,233 B2

(12) United States Patent
Nagashima

(10) Patent No.: US 8,755,233 B2
(45) Date of Patent: Jun. 17, 2014

(54) MEMORY SYSTEM

(75) Inventor: Hiroyuki Nagashima, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 266 days.

(21) Appl. No.: 13/240,014

(22) Filed: Sep. 22, 2011

(65) Prior Publication Data

US 2012/0243329 A1    Sep. 27, 2012

(30) Foreign Application Priority Data

Mar. 25, 2011    (JP) .................................. 2011-068318

(51) Int. Cl.
| *G11C 16/26* | (2006.01) |
| *G11C 16/34* | (2006.01) |
| *G11C 16/14* | (2006.01) |
| *G11C 11/56* | (2006.01) |

(52) U.S. Cl.
CPC ................ *G11C 16/26* (2013.01); *G11C 16/14* (2013.01); *G11C 16/3454* (2013.01); *G11C 16/3459* (2013.01); *G11C 11/5642* (2013.01)
USPC ............. 365/185.22; 365/185.19; 365/185.21

(58) Field of Classification Search
CPC .... G11C 16/14; G11C 16/26; G11C 16/3459; G11C 16/34
USPC ........................... 365/185.19, 185.21, 185.22
See application file for complete search history.

(56) References Cited

U.S. PATENT DOCUMENTS

| 6,744,670 | B2 | 6/2004 | Tamada et al. | |
| 7,532,520 | B2 | 5/2009 | Yanagidaira et al. | |
| 8,315,104 | B2 | 11/2012 | Futatsuyama et al. | |
| 2002/0145913 | A1* | 10/2002 | Tanaka et al. ............ | 365/185.22 |
| 2008/0130370 | A1* | 6/2008 | Mokhlesi ................. | 365/185.22 |
| 2009/0073769 | A1* | 3/2009 | Ronen ...................... | 365/185.19 |
| 2009/0147573 | A1* | 6/2009 | Hemink ................... | 365/185.03 |
| 2010/0097855 | A1* | 4/2010 | Bayle ....................... | 365/185.03 |
| 2011/0078402 | A1 | 3/2011 | Sato | |
| 2012/0239858 | A1* | 9/2012 | Melik-Martirosian ....... | 711/103 |
| 2013/0010541 | A1 | 1/2013 | Futatsuyama et al. | |

FOREIGN PATENT DOCUMENTS

| JP | 2000-30476 | 1/2000 |
| JP | 2003-242787 A | 8/2003 |
| JP | 2004-46985 | 2/2004 |
| JP | 2008-27511 | 2/2008 |

(Continued)

OTHER PUBLICATIONS

Office Action issued May 28, 2013 in Japanese Patent Application No. 2011-068318 with English language translation.

*Primary Examiner* — Ly D Pham
(74) *Attorney, Agent, or Firm* — Oblon, Spivak, McClelland, Maier & Neustadt, L.L.P.

(57) ABSTRACT

According to one embodiment, there is provided memory system including a non-volatile memory device, a monitoring unit, and a changing unit. The non-volatile memory device stores data. The monitoring unit monitors a characteristic of the non-volatile memory device when writing and erasing processes are performed to write and erase the data to and from the non-volatile memory device. The changing unit changes at least one of a value of a writing start voltage and an increase width of a writing voltage in the writing process in accordance with the monitored characteristic so that a time for the writing process is substantially identical to a target value. The writing process is a process in which a writing operation and a verification operation are alternately repeated.

20 Claims, 23 Drawing Sheets

(56) References Cited

FOREIGN PATENT DOCUMENTS

| | | |
|---|---|---|
| JP | 2008-47273 A | 2/2008 |
| JP | 2009-146510 | 7/2009 |
| JP | 2009-283117 | 12/2009 |
| JP | 2010-9733 A | 1/2010 |

\* cited by examiner

MEMORY SYSTEM

CROSS-REFERENCE TO RELATED APPLICATIONS

This application is based upon and claims the benefit of priority from Japanese Patent Application No. 2011-068318, filed on Mar. 25, 2011; the entire contents of which are incorporated herein by reference.

FIELD

Embodiments described herein relate generally to a memory system.

BACKGROUND

Some memory systems such as SSDs (solid state drive) or memory cards include a plurality of NAND-type flash memory devices in which an erasing process is necessary before a writing process is performed. In a process of writing and erasing data to and from the NAND-type flash memory device, electrons are injected to and discharged from a floating gate by applying a high voltage between a substrate and a control gate. If the data writing and erasing process is performed many times to write and erase data in and from the NAND-type flash memory device, a gate insulation film near the floating gate may deteriorate. Thus, the reliability of the NAND-type flash memory device (non-volatile memory device) tends to deteriorate.

DETAILED DESCRIPTION

In general, according to one embodiment, there is provided a memory system including a non-volatile memory device, a monitoring unit, and a changing unit. The non-volatile memory device stores data. The monitoring unit monitors a characteristic of the non-volatile memory device when writing and erasing processes are performed to write and erase the data to and from the non-volatile memory device. The changing unit changes at least one of a value of a writing start voltage and an increase width of a writing voltage in the writing process in accordance with the monitored characteristic so that a time for the writing process is substantially identical to a target value. The writing process is a process in which a writing operation and a verification operation are alternately repeated.

Exemplary embodiments of a memory system will be explained below in detail with reference to the accompanying drawings. The present invention is not limited to the following embodiments.

First Embodiment

In one exemplary embodiment, a memory system (for example, a SSD (solid state drive)) including a plurality of non-volatile memory devices (for example, NAND-type flash memory devices) monitors the characteristics (for example, the frequency of a loop of a writing process or an erasing process) of the non-volatile memory devices by a process of writing or erasing data in and from the non-volatile memory devices in order to determine the deterioration degrees of the non-volatile memory devices.

After the characteristics of the non-volatile memory device are monitored, the monitoring result and a preset threshold value are compared to each other and the deterioration degree of each block in the non-volatile memory device is determined. Further, a writing start voltage is changed in the writing process in accordance with the determination result of the deterioration degree. Here, the writing start voltage is a voltage which is used for a first writing operation in the writing process of alternately reiterating a writing operation and a verification operation while increasing a writing voltage until it is determined (verified) that writing succeeds. Further, the writing start voltage is changed so that a time necessary for the writing process is substantially identical to a target value.

Hereinafter, the memory system serving as an SSD will be explained below in detail with reference to the drawings. However, the exemplary embodiment is applicable to a memory system serving as, for example, a memory card.

First, the configuration of the memory system and the configuration of the NAND-type flash memory device (hereinafter, abbreviated as a NAND device) will be explained with reference to FIGS. 1 to 4. Next, the configuration and operation of the memory system, which is one of the characteristics of the exemplary embodiment, will be described with reference to FIGS. 5 to 10.

Figure 1:
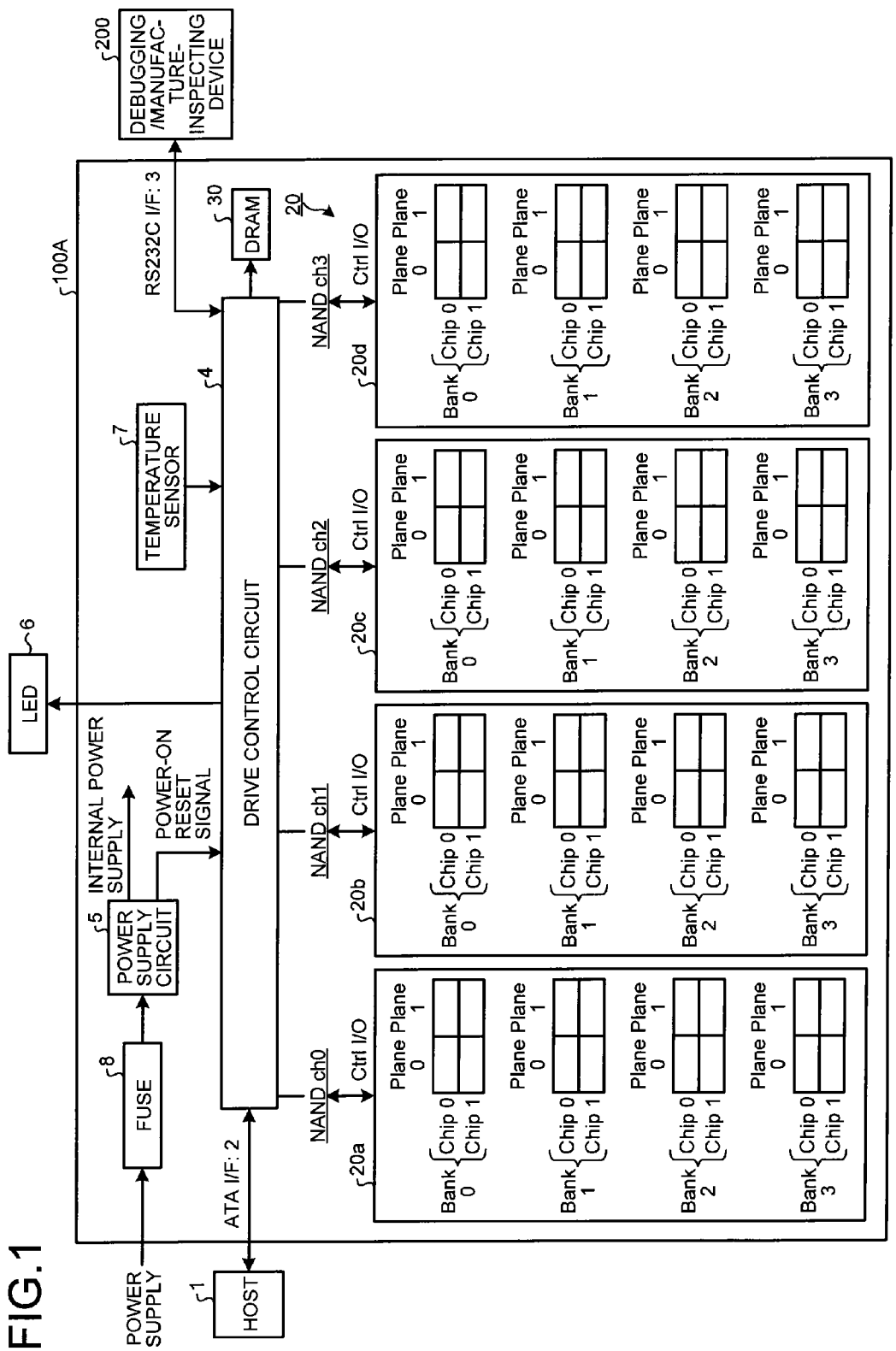
FIG. 1 is a diagram illustrating a hardware configuration of a memory system according to a first embodiment.

FIG. 1 is a block diagram of an example of a configuration of an SSD 100A serving as the memory system. The SSD 100A includes a host connection interface (host I/F 40 described below) connecting the SSD 100A to a host apparatus (hereinafter, abbreviated as a host) 1. In FIG. 1, for example, the host I/F 40 is a memory connection interface such as an ATA interface (ATA I/F) 2. The SSD 100A is connected to the host 1 such as a personal computer or a CPU core via the ATA I/F 2 (the host I/F 40) so as to serve as external memory of the host 1. Further, the SSD 100A can transmit and receive data to and from a debugging/manufacture-inspecting device 200 via a communication interface 3 such as an RS232C interface (RS232C I/F).

The SSD 100A includes NAND-type flash memory (hereinafter, abbreviated as NAND memory) 20 serving as non-volatile semiconductor memory, a drive control circuit 4 serving as a controller, DRAM 30 serving as volatile semiconductor memory, a power supply circuit 5, a status display LED 6, a temperature sensor 7 detecting the inner temperature of a drive, and a fuse 8.

The power supply circuit 5 generates a plurality of different internal direct-current power supply voltages from an outer direct-current power supplied from a power supply circuit on the side of the host 1 and supplies these internal direct-current power supply voltages to circuits of the SSD 100A, respectively. Further, the power supply circuit 5 detects an initial rise of the outer power supply, generates a power-on reset signal, and supplies the power-on reset signal to the drive control circuit 4.

The fuse 8 is installed between the power supply circuit on the side of the host 1 and the power supply circuit 5 inside the SSD 100A. When an excess current is supplied from an external power supply circuit, the fuse 8 is cut so as to prevent an erroneous operation of the internal circuit.

The NAND memory 20 includes, for example, four parallel operation elements 20a to 20d performing a 4-parallel operation. The four parallel operation elements 20a to 20d are connected to the drive control circuit 4 by four channels (ch0 to ch3), respectively. Each of the parallel operation elements 20a to 20d includes a plurality of banks (that is, a plurality of NAND devices) capable of performing a bank interleaving operation. That is, each parallel operation element includes, for example, four banks (Bank 0 to Bank 3), that is, four NAND devices. Each bank (each NAND device) includes a plurality of NAND memory chips, for example, two memory chips (Chip 0 and Chip 1).

For example, each memory chip is divided into two districts, plane 0 and plane 1, which each include a plurality of physical blocks. Plane 0 and plane 1 each include an independent peripheral circuit (for example, a row decoder, a column decoder, a page buffer, a data cache, and the like) and are capable of simultaneously performing erasing/writing/reading by using a double mode.

Each NAND memory chip of the NAND memory 20 is capable of performing a parallel operation by the plurality of channels, a bank interleaving operation by the plurality of banks (that is, the plurality of NAND devices), an interleaving operation by the plurality of chips of the same bank (the same NAND device), and a parallel operation in the double mode using the plurality of planes. Further, each memory chip may include two or more planes or may not be divided.

The DRAM 30 functions as a data transmission cache and work region memory between the host 1 and the NAND memory 20. Examples of the contents stored in the work region memory of the DRAM 30 include a master table (snapshot) in which various management tables stored in the NAND memory 20 are developed at an operation time and log information which is a change difference between the management tables.

Instead of the DRAM 30, another volatile RAM such as SRAM (static random access memory) may be used. The SRAM and the DRAM may coexist in a controller or may be mounted on a substrate inside the SSD as chips separate from the controller. Further, non-volatile RAM may be used such as FeRAM (ferroelectric random access memory), MRAM (magnetoresistive random access memory), or PRAM (phase change random access memory). When the non-volatile RAM is used, it is possible not to perform a part or the entirety of an operation of saving the various management tables in the NAND memory 20 at a power cut-off time.

The drive control circuit 4 controls transmission of data between the host 1 and the NAND memory 20 via the DRAM 30 and also controls each constituent element of the SSD 100A. Further, the drive control circuit 4 has a function of supplying a status display signal to the status display LED 6 and a function of receiving the power-on reset signal from the power supply circuit 5 and supplying the drive control circuit 4 and each unit of the SSD 100A.

Each NAND memory chip has a configuration in which a plurality of physical blocks is arrayed, each of which is a data erasing unit.

Figure 2A:
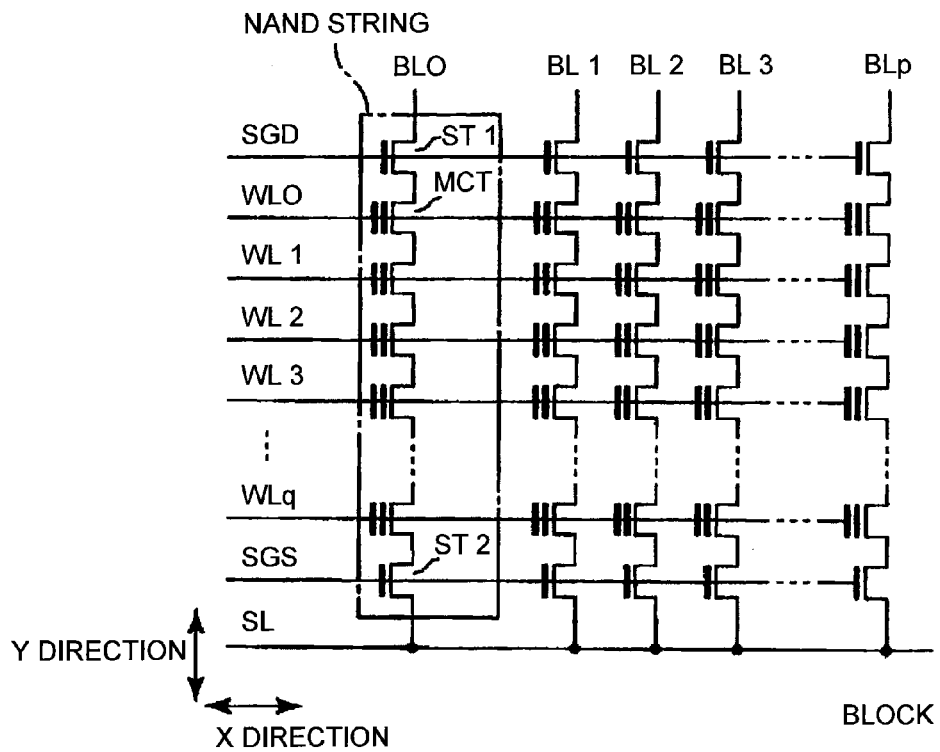
FIGS. 2A and 2B are diagrams illustrating a circuit configuration and operation of a non-volatile memory device according to the first embodiment.

FIG. 2A is a circuit diagram of an example of a configuration of one physical block included in the NAND memory chip. Each physical block includes (p+1) NAND strings arranged in order in an X direction (where p is an integer equal to or greater than 0). The drain of a selection transistor ST1 included in each NAND string is connected to bit lines BL0 to BLp and the gate thereof is connected commonly to a selection gate line SGD. The source of a selection transistor ST2 is connected commonly to a source line SL and the gate thereof is connected commonly to a selection gate line SGS.

Each memory cell transistor (also referred to as a memory cell) MCT is configured by a MOSFET (metal oxide semiconductor field effect transistor) having a laminated-layer gate structure formed on a semiconductor substrate. The laminated-layer gate structure includes a charge storage layer (floating gate electrode) formed on the semiconductor substrate with a gate insulation film interposed therebetween and a control gate electrode formed on the charge storage layer with an inter-gate insulation film interposed therebetween. The memory cell transistor MCT store data in accordance with a difference in a threshold voltage changed in accordance with the number of electrons stored in the floating gate electrode. The memory cell transistor MCT may be configured to store one bit or configured to store multiple values (data of 2 bits or more).

The memory cell transistor MCT is not limited to the configuration including the floating gate electrode, but may have a configuration in which the threshold voltage can be adjusted by trapping electrons in a nitride film interface serving as a metal-oxide-nitride-oxide-silicon (MONOS)-type charge storage layer. The memory cell transistor MCT with the MONOS structure may also be configured to store one bit or configured to store multiple values (data of 2 bits or more).

In each NAND string, the (q+1) memory cell transistors MCT are arranged so that respective current paths are connected to each other in series between the source of the selection transistor ST1 and the drain of the selection transistor ST2. That is, the plurality of memory cell transistors MCT is connected in series in a Y direction so that adjacent diffusion regions (source regions or drain regions) are shared.

In the respective NAND strings, the control gate electrodes are connected to word lines WL0 to WLq, respectively, in order from the memory cell transistor MCT located closest to the selection gate line SGD. Accordingly, the drain of the memory cell transistor MCT connected to the word line WL0 is connected to the source of the selection transistor ST1 and the source of the memory cell transistor MCT connected to the word line WLq is connected to the drain of the selection transistor ST2.

The word lines WL0 to WLq connect the control gate electrodes of the memory cell transistors MCT commonly to each other between the NAND strings inside the physical block. That is, the control gate electrodes of the memory cell transistors MCT of the same row in the block is connected to the same word line WL. The (p+1) memory cell transistors MCT connected to the same word line WL are treated as one page (physical page), so that data is written and read for each physical page.

Further, bit lines BL0 to BLp connect the drains of the selection transistors ST1 commonly to each other between the blocks. That is, the NAND string of the same column is connected to the same bit line BL in the plurality of blocks.

Figure 2B:
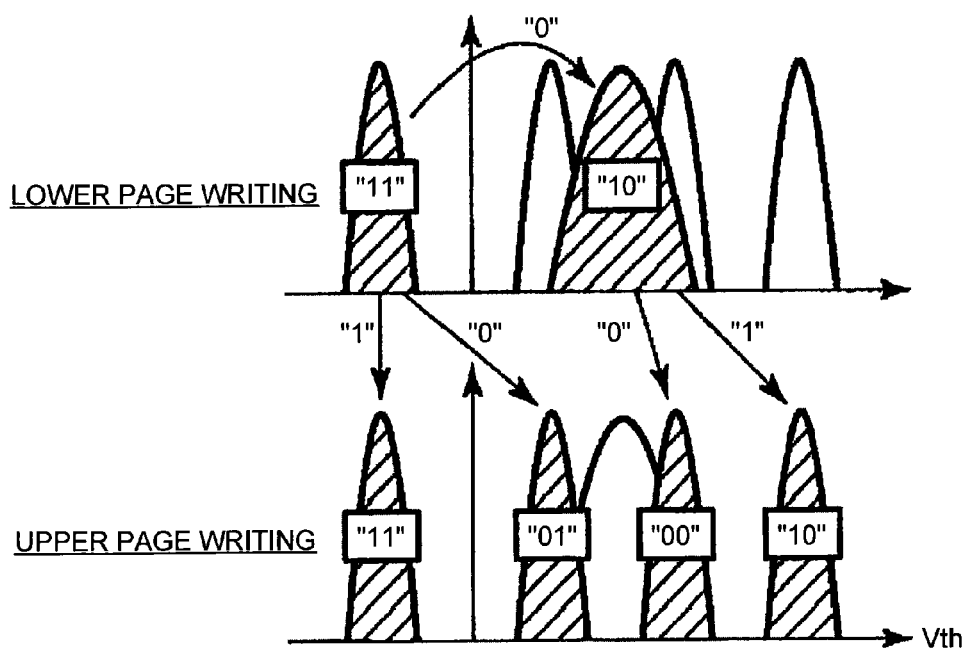

FIG. 2B is a schematic diagram of a threshold distribution of a 4-value data storage type for storing two bits in one memory cell transistor MCT, for example. According to the 4-value data storage type, one of 4-value data "xy" defined as upper page data "x" and lower page data "y" can be retained in one memory cell transistor MCT.

As for the 4-value data "xy", for example, data "11", "01", "00", and "10" can be allocated in order of the threshold voltages of the memory cell transistors MCT. The data "11" indicate an erasing status in which the threshold voltage of the memory cell transistor MCT is, for example, negative. The data allocation rule is not limited thereto. Further, three bits or more may be stored in one memory cell transistor MCT.

In a lower page writing operation, the data "10" is written by selectively writing the lower bit data "y" in the memory cell transistor MCT of the data "11" (erasing status). The threshold distribution of the data "10" before an upper page writing operation is located between the threshold distributions of the data "01" and the data "00" after the upper page writing, and thus may be broader than the threshold distribution after the upper page writing operation. In the upper page writing operation, the data "01" and the data "00" are written by selectively writing the upper bit data "x" in the memory cell of the data "11" and the memory cell of the data "10." A pseudo SLC mode performs writing by using only a lower page. The operation of writing a lower page is performed at higher speed in comparison to the operation of writing an upper page.

Figure 3:
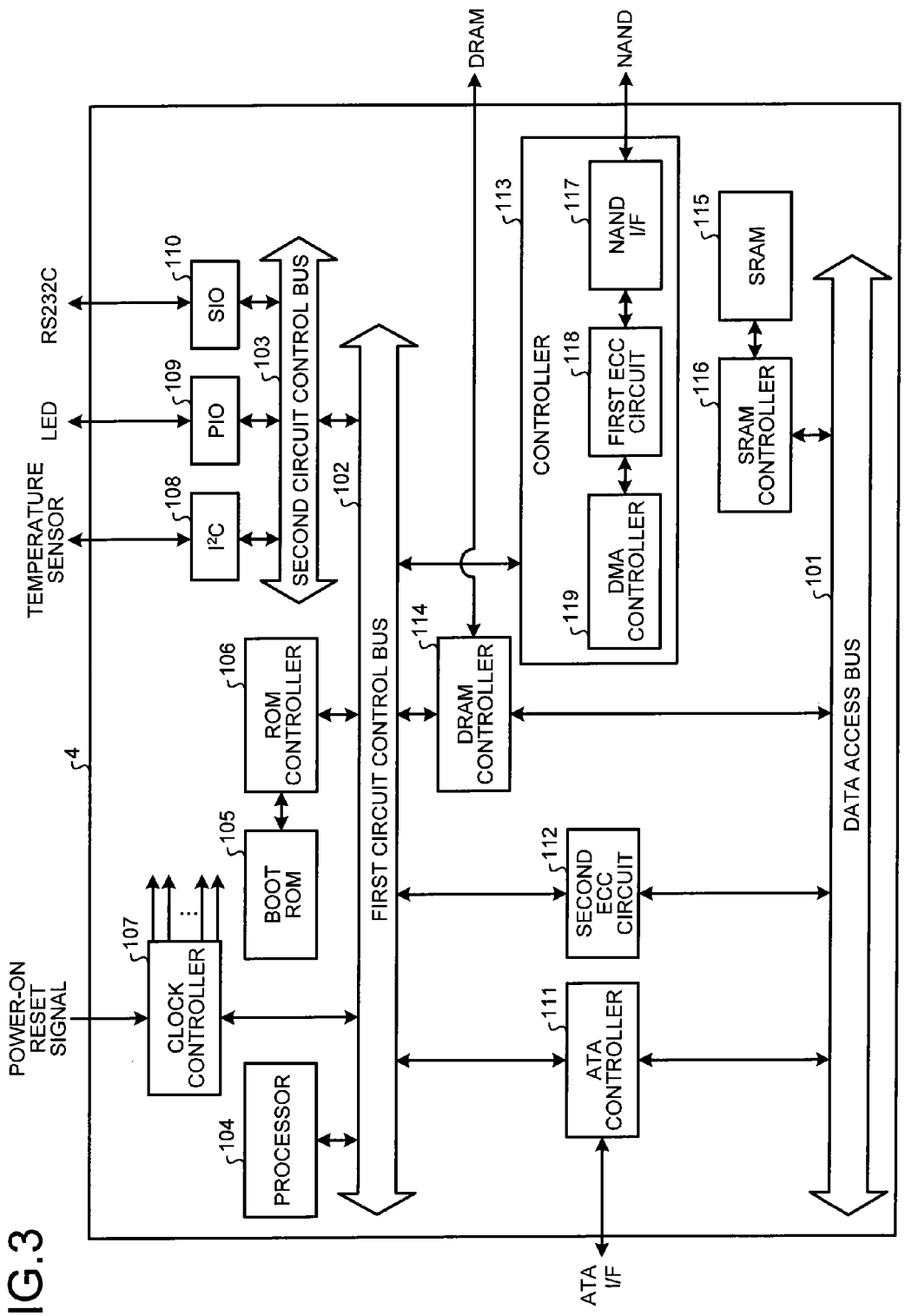
FIG. 3 is a diagram illustrating a configuration of a drive control circuit according to the first embodiment.

FIG. 3 is a block diagram of an example of an internal hardware configuration of the drive control circuit 4. The drive control circuit 4 includes a data access bus 101, a first circuit control bus 102, and a second circuit control bus 103. A processor 104 controls the entire drive control circuit 4 is connected to the first circuit control bus 102. Boot ROM 105 is connected to the first circuit control bus 102 via a ROM controller 106. The boot ROM 105 stores a booting program for booting each management program (firmware (FW)) stored in the NAND memory 20.

A clock controller 107 is connected to the first circuit control bus 102. The clock controller 107 receives the power-on reset signal from the power supply circuit 5 illustrated in FIG. 1 and supplies a reset signal and a clock signal to each unit.

The second circuit control bus 103 is connected to the first circuit control bus 102. An $I^2C$ circuit 108, which receives data from the temperature sensor 7 illustrated in FIG. 1, is connected to the second circuit control bus 103, a parallel IO (PIO) circuit 109, which supplies status display signal to the status display LED 6, is connected thereto, and a serial IO (SIO) circuit 110, which controls the RS232C I/F 3, is connected thereto.

An ATA interface controller (ATA controller) 111, a ECC (second error checking and correction) circuit 112, a controller 113 serving as a NAND controller, and a DRAM controller 114 are connected both the data access bus 101 and the first circuit control bus 102. The ATA controller 111 transmits and receives data to and from the host 1 via the ATA interface 2 (see FIG. 1). SRAM 115 used as a data work region and a firmware development region is connected to the data access bus 101 via the SRAM controller 116. The firmware stored in the NAND memory 20 is transmitted to the SRAM 115 by the booting program stored in the boot ROM 105 when the firmware operates.

The controller 113 includes a NAND I/F 117, a first ECC circuit 118, and a DMA transmission control DMA controller 119. The NAND I/F 117 performs an interface process with the NAND memory 20. The DMA transmission control DMA controller 119 controls access between the NAND memory 20 and the DRAM 30. The first ECC circuit 118 performs encoding a second correction code and performs encoding and decoding a first error correction code. The second ECC circuit 112 performs decoding a second error correction code. The first ECC and the second ECC include, for example, a hamming code, a BCH (Bose Chaudhuri Hocquenghem) code, a RS (Reed Solomon) code, or a LDPC (low density parity check) code. A correction capability of the second ECC is assumed to be better than the correction capability of the first ECC.

As illustrated in FIG. 1, the four parallel operation elements 20a to 20d of the NAND memory 20 are connected in parallel to the controller 113 inside the drive control circuit 4 via four channels of a plurality of bits, respectively, so that the four parallel operation elements 20a to 20d can operate in parallel. Further, the NAND memory 20 of each channel is divided into four banks (that is, four NAND devices) capable of performing the bank interleaving operation, so that access to plane 0 and plane 1 of each memory chip can be simultaneously performed. Accordingly, it is possible to control the maximum eight physical blocks (four banks by two planes) per channel nearly simultaneously. That is, it is possible to perform writing or the like on the maximum eight physical blocks simultaneously.

Figure 4:
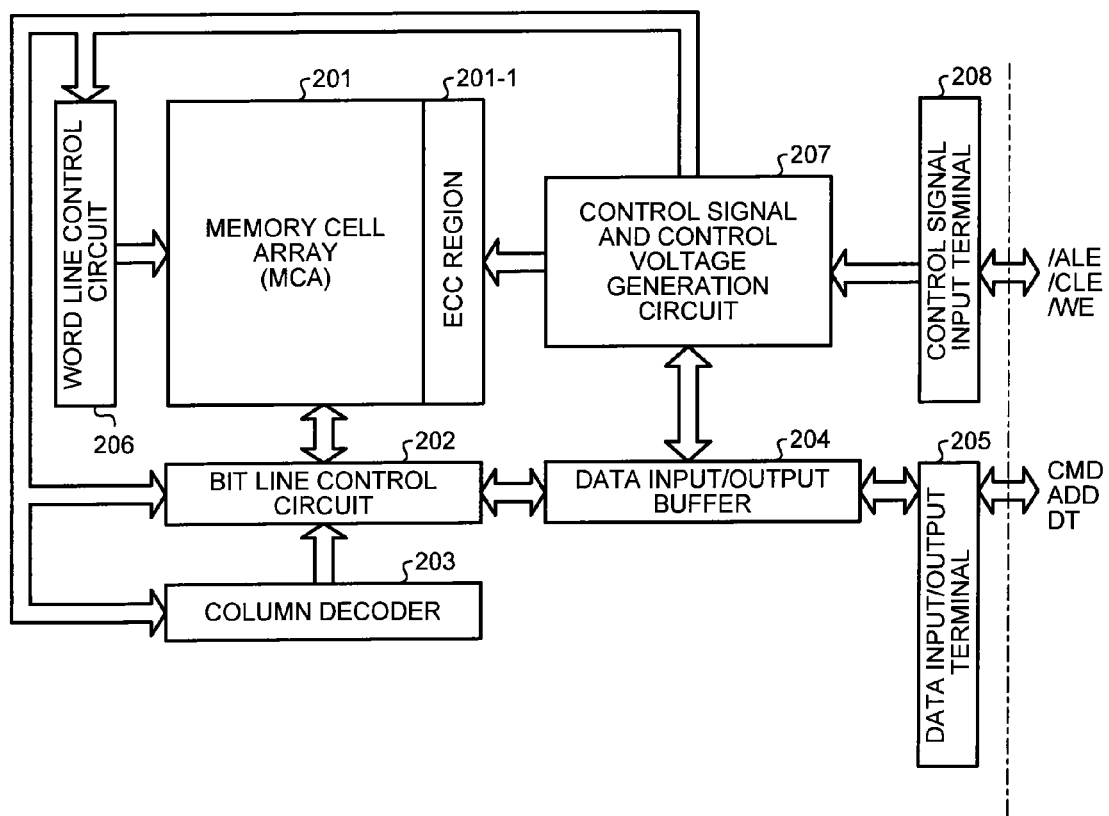
FIG. 4 is a diagram illustrating a functional configuration of the non-volatile memory device according to the first embodiment.

FIG. 4 is a functional block diagram of an example of one NAND memory chip (NAND-type flash memory) illustrated in FIG. 1.

A memory cell array 201 includes a plurality of bit lines, a plurality of word lines, and a common source line. In the memory cell array 201, memory cells, which are configured by EEPROM cells and are capable of electrically rewriting data, are arrayed in a matrix form (in which a plurality of rows and a plurality of columns are formed). A bit line control circuit 202 is connected to the memory cell array 201 to control the bit lines and a word line control circuit 206 is connected thereto to control the word lines.

The bit line control circuit 202 is connected to the memory cells arrayed in the plurality of columns via the plurality of bit lines. The bit line control circuit 202 reads data of the memory cells via the bit lines, detects the status of the memory cells via the bit lines, and writes data in the memory cells by applying a writing control voltage via the bit lines. A column decoder 203 and a data input/output buffer 204 are connected to the bit line control circuit 202.

A data storage circuit in the bit line control circuit 202 is selected by the column decoder 203. The data of the memory cells read to the data storage circuit are output from the input/output terminal 205 to the outside via the data input/output buffer 204. The input/output terminal 205 is connected to the drive control circuit 4 outside the memory chips.

The drive control circuit 4 receives the data output from the data input/output terminal 205. Further, the drive control circuit 4 outputs various commands CMD, addresses ADD, and data DT used for controlling the operation of the NAND-type flash memory. The writing data input from the drive control circuit 4 to the data input/output terminal 205 is supplied to the data storage circuit selected by the column decoder 203 via the data input/output buffer 204. A control signal and control voltage generation circuit 207 is supplied with the commands and addresses supplied to the data storage circuit selected by the column decoder 203.

The word line control circuit 206 is connected to the memory cells arrayed in the plurality of rows. The word line control circuit 206 selects the word lines of the memory cell array 201 and applies a voltage necessary for reading, writing, or erasing data to the memory cells via the selected word lines.

The memory cell array 201, the bit line control circuit 202, the column decoder 203, the data input/output buffer 204, and the word line control circuit 206 are connected to the control signal and control voltage generation circuit 207 and are controlled by the control signal and control voltage generation circuit 207.

The control signal and control voltage generation circuit 207 is connected to a control signal input terminal 208 and is controlled in accordance with various control signals such as an ALE (address latch enable) signal, a CLE (command latch enable) signal, and a WE (write enable) signal input from the drive control circuit 4 via the control signal input terminal 208 and the commands CMD input from the drive control circuit 4 via the data input/output terminal 205 and the data input/output buffer 204.

The control signal and control voltage generation circuit 207 generates a voltage to be supplied to be the word lines or the bit lines at the data writing time and generates a voltage to be supplied to wells. The control signal and control voltage generation circuit 207 includes, for example, a boosting circuit such as a charge pump circuit and is configured to generate a writing voltage, a reading voltage, and an erasing voltage.

The control signal and control voltage generation circuit 207 is configured to change the level of the reading voltage, as described below. That is, the control signal and control voltage generation circuit 207 has a function of receiving the various control signals input via the control signal input terminal 208 and the commands CMD input via the data input/output terminal 205 and the data input/output buffer 204 and shifting the voltage to be applied to the word lines in a + direction or a − direction at the reading time.

The bit line control circuit 202, the column decoder 203, the word line control circuit 206, and the control signal and control voltage generation circuit 207 are configured to form a writing circuit and a reading circuit.

The memory cell array 201 includes not only a storage region to store the main data but also a storage region 201-1 to store an ECC (Error Correction Code).

In the SSD 100A, gate insulation films of the memory cells in the NAND memory 20 may deteriorate when the number of times of a writing process or the number of times of an erasing process increase. Therefore, electrons in the gate insulation films are easily trapped. For this reason, in order to extract the electrons from the gate insulation films at an erasing time, it is necessary to apply a high voltage many times with the increase in the number of times of the erasing process. Further, since a threshold value of the cells is raised due to the electrons trapped in the gate insulation films, the writing process ends with a small number of times of voltage application. Accordingly, since a correlation is established between the number of times of the voltage application and the deterioration in the cells, for example, the deterioration degree of the NAND memory 20 is monitored using the correlation in this embodiment.

Figure 5:
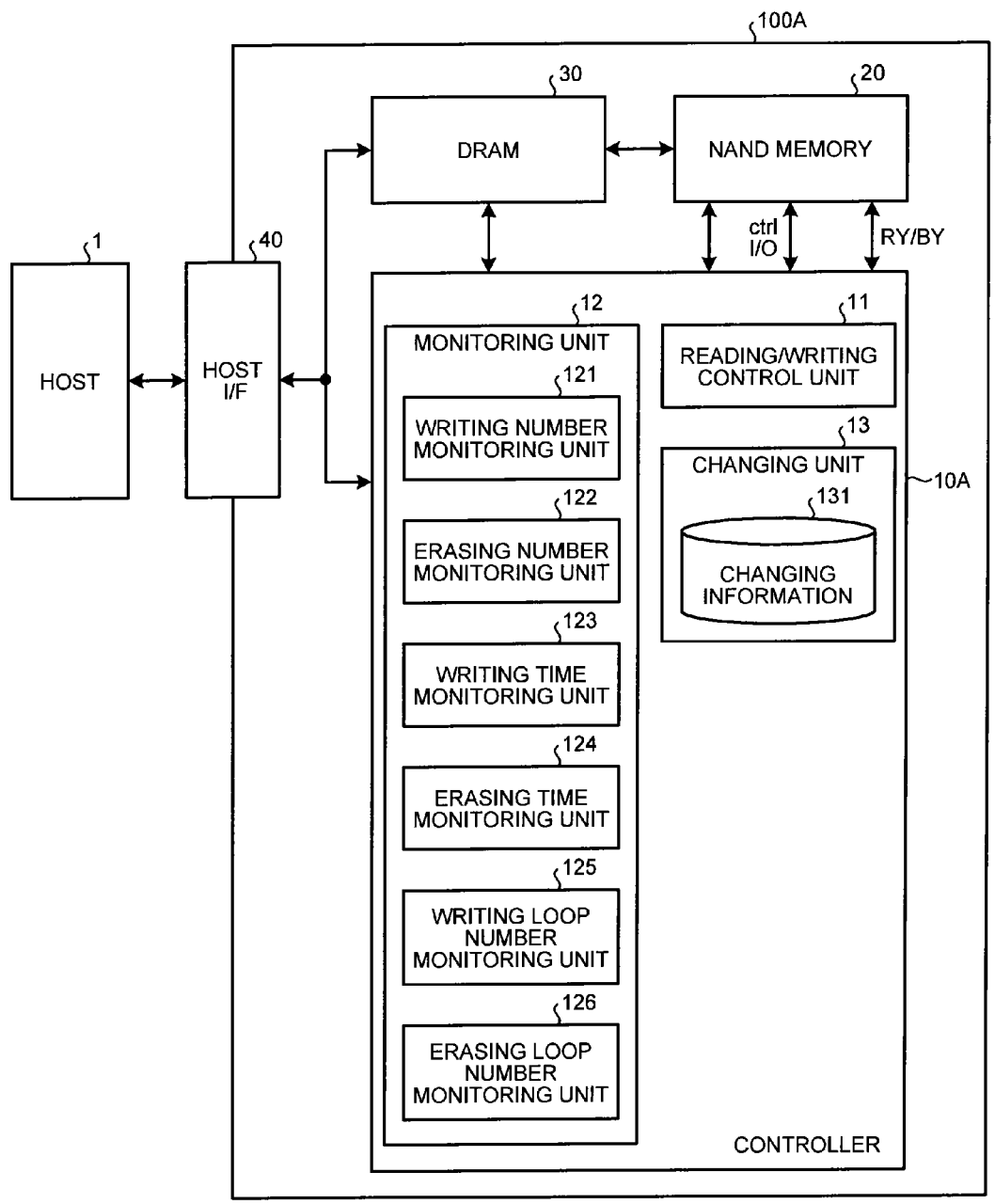
FIG. 5 is a diagram illustrating a functional configuration of a memory system according to the first embodiment.

Next, the configuration and operation of the SSD 100A according to this exemplary embodiment will be described. FIG. 5 is a functional block diagram of an example of the functional configuration of the SSD serving as the memory system according to the first embodiment. The SSD 100A includes a controller 10A (the drive control circuit 4), the NAND memory 20, the DRAM 30, and the host I/F 40.

The NAND memory 20 stores user data designated by the host 1 or stores management information managed by the DRAM 30 for backup. The NAND memory 20 includes a memory cell array in which a plurality of memory cells is arrayed in a matrix form and an individual memory cell can store multiple values by the use of upper and lower pages. The NAND memory 20 includes the plurality of NAND memory chips and each NAND memory chip is configured such that a plurality of blocks, which is a data erasing unit, is arrayed. The NAND memory 20 performs processes of writing and reading data for each physical page. The physical block includes a plurality of physical pages.

The physical block address is a fixed address which is allocated to the physical block. A logic block address is an address designated from the host 1 and is a changeable address allocated to a logic block which is a virtual block. For example, the logic block refers to a virtual block which is configured by a combination of the plurality of physical blocks.

The DRAM 30 is used as a data transmitting storage unit and a management information recording storage unit. Specifically, the data transmitting storage unit (data transmitting cache region) is used to temporarily store the data requested to be written by the host 1 before the data is written in the NAND memory 20 or is used to read data requested to be read by the host 1 from the NAND memory 20 and temporarily store the data. The management information recording storage unit is used to store various kinds of management information: management information (for example, correspondence between the logic addresses and physical addresses) used to manage the storage positions of the data stored in the NAND memory 20; management information used to manage a writing number Nw and an erasing number Ne described below in the physical block unit; management information used to manage a writing time WT and an erasing time ET described below in the physical block unit; and management information used to manage a loop number Lw at the writing time and a loop number Le at the erasing moment described below in the physical block unit.

The NAND memory 20 stores a writing/erasing number management table (not illustrated), a writing/erasing time management table (not illustrated), or a writing/erasing loop number management table (not illustrated). These tables are read from the NAND memory 20 and are stored in the DRAM 30, when the system operates. The writing/erasing number management table is a table which manages the writing number Nw, which is the number of times of writing, and the erasing number Ne, which is the number of times of erasing in the physical block unit (physical block address unit). The latest cumulated numbers substantially monitored are registered as the writing number Nw and the erasing number Ne. The writing/erasing time management table is a table which manages the writing time WT necessary for the writing process and the erasing time ET necessary for the erasing process in the physical block unit (physical block address unit). The latest times substantially monitored are registered as the writing time WT and the erasing time ET. The loop number management table is a table which manages the loop number Lw at the writing time, which is the number of times of loop at the writing time, and the loop number Le at the erasing moment, which is the number of times of loop at the erasing moment, in the number of times of erasing in the physical block unit (physical block address unit). As the loop number Lw at the writing time, used is the number of time of loop (smallest value) (page varies most widely over time) of the page in which the number of times of loop is the smallest at the writing time in the physical blocks. The latest numbers of times of loop substantially monitored are registered as the loop number Lw at the writing time and the loop number Le at the erasing moment.

The controller 10A controls the transmission of data between the host 1 and the NAND memory 20 via the DRAM 30 and has software controlling each constituent element of the SSD 100A. The controller 10A and the NAND memory 20 are connected to each other by a control I/O line (Ctrl I/O) used to input and output commands, addresses, data, and the like. A ready/busy signal (Ry/By), which indicates whether the NAND memory 20 is in a ready state or a busy state, is input from the NAND memory 20 to the controller 10A. The controller 10A is a functional constituent element and includes, for example, at least a part of at least one of the processor 104 and the controller 113 illustrated in FIG. 3.

The controller 10A includes a reading/writing control unit 11, a monitoring unit 12, and a changing unit 13.

The reading/writing control unit 11 controls reading and writing data from and to the NAND memory 20 through a cache region of the DRAM 30 based on the management information stored in the DRAM 30.

The monitoring unit 12 monitors the characteristics of the NAND device by the processes of writing and erasing the data to and from the NAND device. The monitored characteristics of the NAND device include at least one of, for example, the number Nw of times of the writing process, the number Ne of times of the erasing process, the writing time WT necessary for the writing process, the erasing time ET necessary for the erasing time, a repetition number (the loop number Lw at the writing time) of a writing operation and a verification operation of the writing process, and a repetition number (the loop number Le at the erasing moment) of an erasing operation and a verification operation of the erasing process. That is, the monitoring unit 12 includes at least one of a writing number monitoring unit 121, an erasing number monitoring unit 122, a writing time monitoring unit 123, an erasing time monitoring unit 124, a writing loop number monitoring unit 125, and an erasing loop number monitoring unit 126. The monitoring unit 12 including all of these units will be exemplified below.

The writing number monitoring unit 121 measures the writing number Nw of each physical page with the number of times of the writing process on the physical pages or a predetermined period or frequency decided in advance. For example, the writing number monitoring unit 121 receives a notification indicating that the writing process is performed when the writing process is performed on the physical pages and increments a count number of the writing number Nw of the physical pages. The writing number monitoring unit 121 registers the incremented writing number Nw to an entry of the physical block corresponding to the writing/erasing number management table.

The erasing number monitoring unit 122 measures a count value of the erasing number Ne of each physical block of the NAND memory 20 with the number of times of the erasing process on the physical pages or a predetermined period or frequency decided in advance. For example, the erasing number monitoring unit 122 receives a notification indicating that the erasing process is performed when the erasing process is performed on the physical pages and, increments the count number of the erasing number Ne of the physical pages. The erasing number monitoring unit 122 registers the incremented erasing number Ne to an entry of the physical block corresponding to the writing/erasing number management table.

The writing time monitoring unit 123 measures a writing time WTp of each physical page with the number of times of the writing process on the physical pages or a predetermined period or frequency decided in advance. That is, in the writing process, a writing operation of writing data to the physical page and a verification operation of determining (verifying) whether the data is successfully written by the writing operation are alternately reiterated. Specifically, in the writing process, the writing operation and the verification operation are performed at a program start voltage, and then the writing operation and the verification operation are reiterated while increasing the writing voltage by a substantially constant increase width until it is determined that the writing succeeds (see FIG. 10). As the writing time WTp, a time from the first writing operation to the verification operation in which it is determined that the writing succeeds is measured.

In the writing process, the writing process is performed by inputting a command "80h", an address, data, and a command "10h" indicating the writing via the control I/O line. During the writing process, the ready/busy signal (Ry/By) is lowered to be busy. When the writing process ends, the ready/busy signal (Ry/By) is raised to be ready, a command "70h" is input via the control I/O line, and a status signal (normal end/abnormal end or the like) is output in response to this command.

The writing time monitoring unit 123 monitors the ready/busy signal (Ry/By) after the writing command "80h" is input and measures, as the page writing moment WTp, a time (tPROG) in which the ready/busy signal (Ry/By) is lowered to be busy and is raised to be ready. In this way, the writing time monitoring unit 123 measures the page writing moment WTp of each page and converts the measured page writing moment WTp of each page into the writing time WT of the physical block unit. Any technique described below is used as a technique for calculating the writing time WT of the physical block unit.

An average value of the page writing moments WTp of the respective pages in the physical block is calculated.

The shortest page writing moment (a page changed most widely over time) is used as the writing time WT of the corresponding physical block.

The page writing moment of a predetermined physical page decided in advance is used as the writing time WT of the corresponding physical block.

The writing time monitoring unit 123 registers the obtained writing time WT in an entry of the corresponding physical block of the writing/erasing time management table.

The erasing time monitoring unit 124 measures the erasing time ET of each physical block with the number of times of the erasing process on the physical pages of the NAND memory 20 or a predetermined period or frequency decided in advance. That is, in the erasing process, an erasing operation of erasing the data to the physical page and the verification operation of determining (verifying) whether the data is successfully erased by the erasing operation are alternately reiterated. Specifically, in the erasing process, the erasing operation and the verification operation are performed at an erasing start voltage, and then the erasing operation and the verification operation are reiterated while increasing the erasing voltage by a substantially constant increase width until it is determined that the erasing succeeds (see FIG. 19A). As the erasing time ET, a time from the first erasing operation to the verification operation in which it is determined that the erasing succeeds is measured.

In the erasing process, the erasing process is performed by inputting a command "60h", an address, and a command "D0h" indicating the erasing via the control I/O line. During the erasing process, the ready/busy signal (Ry/By) is lowered to be busy. When the erasing process ends, the ready/busy signal (Ry/By) is raised to be ready, the command "70h" is input via the control I/O line, and a status signal (normal end/abnormal end or the like) is output in response to this command.

The erasing time monitoring unit 124 monitors the ready/busy signal (Ry/By) after the erasing command "60h" is input and measures, as the page erasing time ET, a time (tBErase) in which the ready/busy signal (Ry/By) is lowered to be busy and is raised to be ready. The erasing time monitoring unit 124 registers the obtained erasing time ET in an entry of the corresponding physical block of the writing/erasing time management table.

The writing loop number monitoring unit 125 acquires, from the NAND memory 20, a loop number Lwp at the page writing moment, which is the number of times of loop at the writing time of the physical page, with the number of times of the writing process on the physical pages or a predetermined period or frequency decided in advance. That is, it is assumed that the writing operation and the verification operation in the writing process are one loop, the number of times of the loop is measured as the loop number Lwp at the writing time, and the measurement result is acquired by the writing loop number monitoring unit 125.

In the writing process, the writing process is performed by inputting the command "80h" indicating the writing, the address, the data, and the command "10h" via the control I/O line. During the writing process, the ready/busy signal (Ry/By) is lowered to be busy. When the writing process ends, the ready/busy signal (Ry/By) is raised to be ready. When the writing loop number monitoring unit 125 detects the ready/busy signal (Ry/By) is raised to be ready, the writing loop number monitoring unit 125 inputs a command "Loop Count Command" via the control I/O line. The NAND memory 20 outputs a status signal (the loop number Lwp at the page writing moment and the normal end/abnormal end or the like) for the immediately previous writing process in response to the command "Loop Count Command."

The NAND memory 20 monitors the ready/busy signal (Ry/By) after the writing command "80h" is input. The NAND memory 20 measures, as the loop number Lwp at the writing time (the number of times of program pulses), the number of times of the voltage applied to the memory cells of the NAND memory 20 until the ready/busy signal (Ry/By) is lowered to be busy and is raised to be ready, and sends the measured loop number Lwp at the page writing moment as the status signal to the writing loop number monitoring unit 125.

The writing loop number monitoring unit 125 receives the loop number Lwp of each page at the page writing moment from the NAND memory 20 and converts the received loop number Lwp of each page at the page writing moment into the loop number Lw at the writing time in the physical block unit. As a technique for requesting the loop number Lw at the writing time in the physical block unit, the smallest loop number at the page writing moment (a page varies most widely over time) is used as the loop number Lw at the writing time of the physical block. The writing loop number monitoring unit 125 registers the obtained loop number Lw at the writing time in the entry of the corresponding physical block of the above writing/erasing loop number management table.

The erasing loop number monitoring unit 126 acquires, from the NAND memory 20, the loop number Le at the erasing moment of each physical block with the number of times of the erasing process on the physical pages of the NAND memory 20 or a predetermined period or frequency decided in advance. That is, it is assumed that the erasing operation and the verification operation in the erasing process are one loop, the number of times of the loop is measured as the loop number Le at the erasing moment, and the measurement result is acquired by the erasing loop number monitoring unit 126.

In the erasing process, the erasing process is performed by inputting the command "60h" indicating the erasing, the address, and the command "D0h" via the control I/O line. During the erasing process, the ready/busy signal (Ry/By) is lowered to be busy. During the erasing process, a predetermined application voltage is input to the NAND memory 20 plural times while the application voltage is increased little by little. When the erasing process ends, the ready/busy signal (Ry/By) is raised to be ready. When the erasing loop number monitoring unit 126 detects the ready/busy signal (Ry/By) is raised to be ready, the erasing loop number monitoring unit 126 inputs the command "Loop Count Command" via the control I/O line. The NAND memory 20 outputs the status signal (the loop number Le at the erasing moment and the normal end/abnormal end or the like) for the immediately previous erasing process in response to the command "Loop Count Command."

The NAND memory 20 monitors the ready/busy signal (Ry/By) after the erasing command "60h" is input. The NAND memory 20 measures, as the loop number Le at the erasing moment (the number of times of erasing pulses), the number of times of the voltage applied to the blocks of the NAND memory 20 until the ready/busy signal (Ry/By) is lowered to be busy and is raised to be ready, and sends the measured loop number Le at the erasing moment as the status signal to the erasing loop number monitoring unit 126. The erasing loop number monitoring unit 126 registers the loop number Le at the erasing moment from the NAND memory 20 in the entry of the corresponding physical block of the above writing/erasing loop number management table.

The changing unit 13 compares the characteristics of the NAND device monitored by the monitoring unit 12 to a predetermined threshold value and determines a deterioration degree of each block of the NAND device in accordance with the comparison result and the changing information 131. Further, the changing unit 13 changes the writing start voltage of the writing process in accordance with the comparison result of the deterioration degree and the changing information 131 so that the writing time WT is substantially identical to a target value. The changing unit 13 performs this process, for example, in the physical block unit.

Figure 7A:
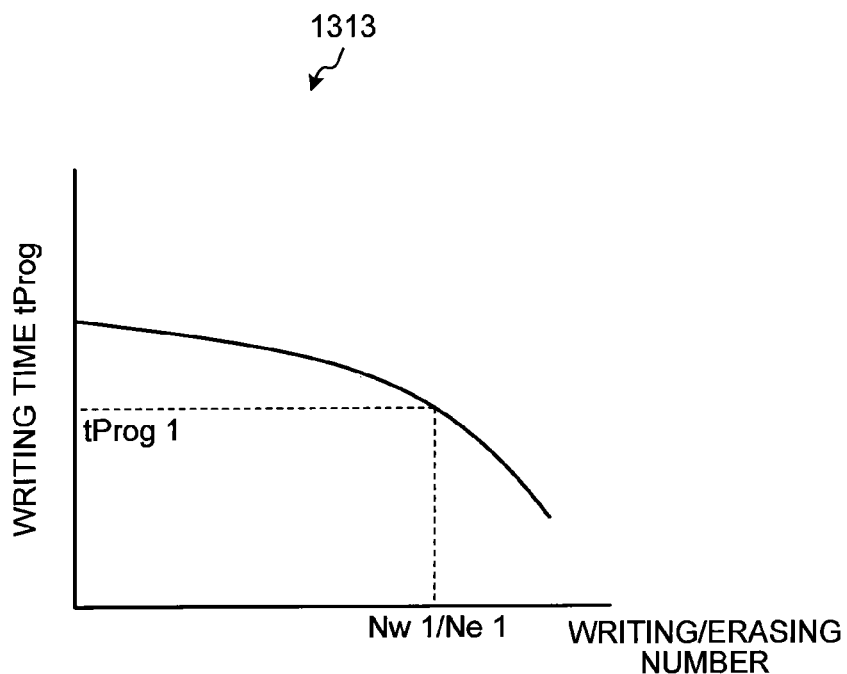
FIGS. 7A and 7B are diagrams illustrating the data structure of change information according to the first embodiment.
Figure 7B:
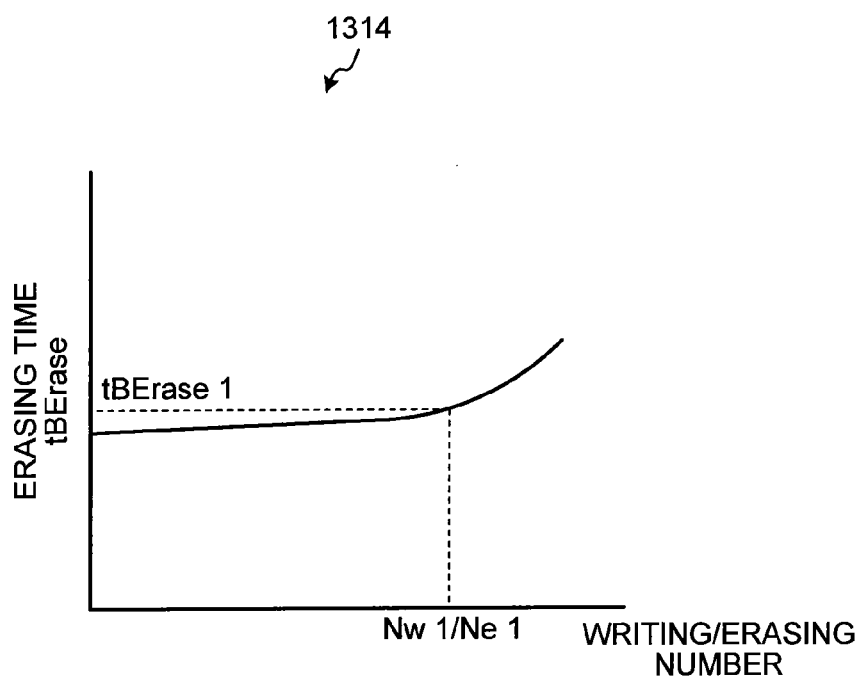
Figure 8A:
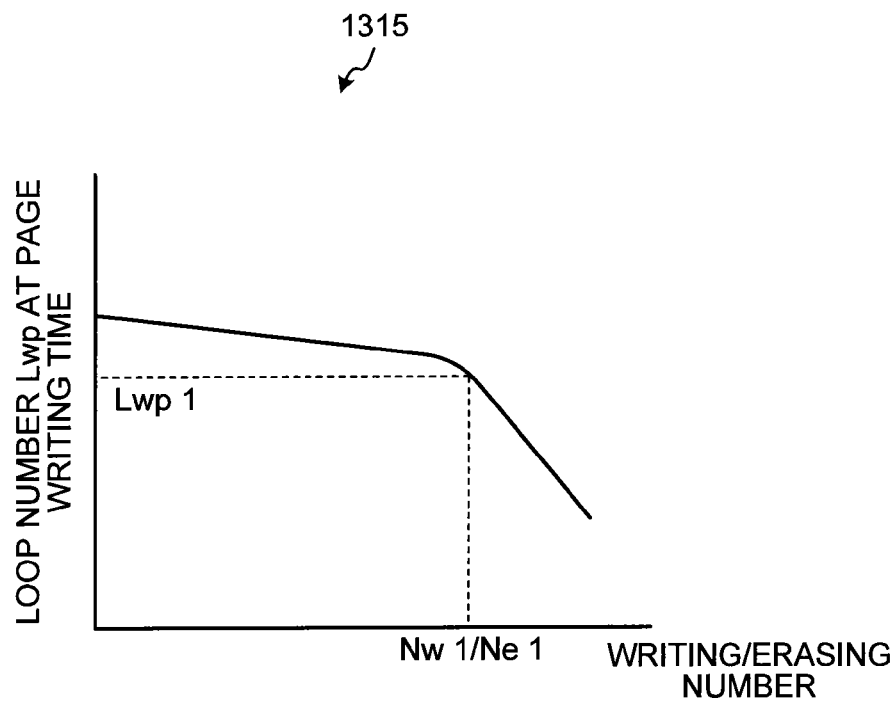
FIGS. 8A and 8B are diagrams illustrating the data structure of change information according to the first embodiment.
Figure 8B:
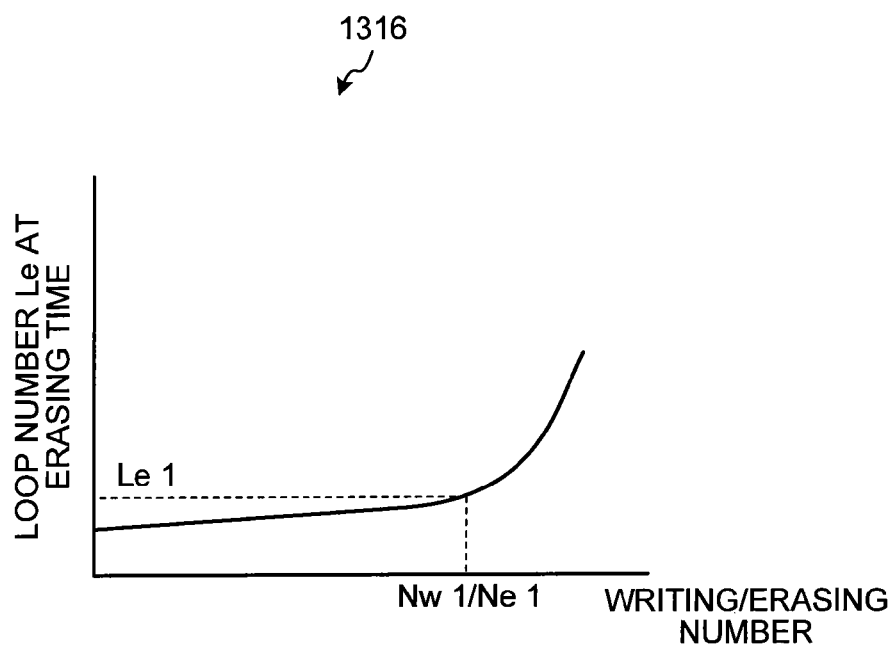
Figure 9:
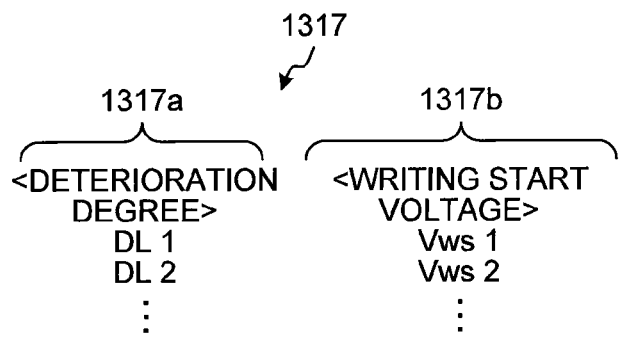
FIG. 9 is a diagram illustrating the data structure of change information according to the first embodiment.

Specifically, for example, the changing information which the changing unit 13 refers to includes tables 1311 to 1316 illustrated in FIGS. 6A to 8B and used to determine the deterioration degree from the characteristics of the NAND device and a table 1317 illustrated in FIG. 9 and used to determine the writing start voltage from the deterioration degree.

Figure 6A:
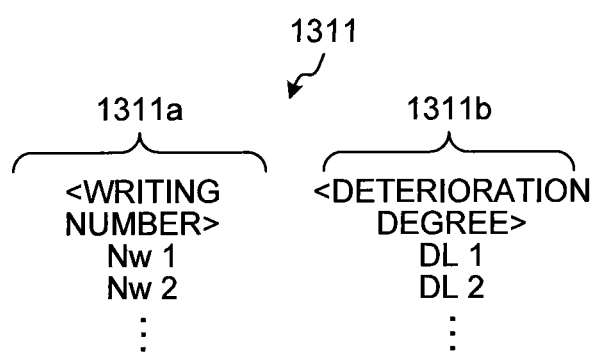
FIGS. 6A and 6B are diagrams illustrating a data structure of change information according to the first embodiment.

FIG. 6A illustrates the table 1311 which is acquired in advance experimentally and indicates a relation between the writing number Nw and the deterioration degree. The table 1311 includes a writing number column 1311a and a deterioration degree column 1311b. The writing number column 1311a records threshold values Nw1, Nw2, etc. used to determine the deterioration degree. The deterioration degree column 1311b records deterioration degrees DL1, DL2, etc. listed by ranking or quantifying the deterioration progress of the NAND device over time in numeral terms. Referring to the table 1311, it can be determined that the deterioration degree of the NAND device reaches the deterioration degree DL1, for example, when the writing number Nw monitored by the writing number monitoring unit 121 is equal to or greater than the threshold value Nw1.

Figure 6B:
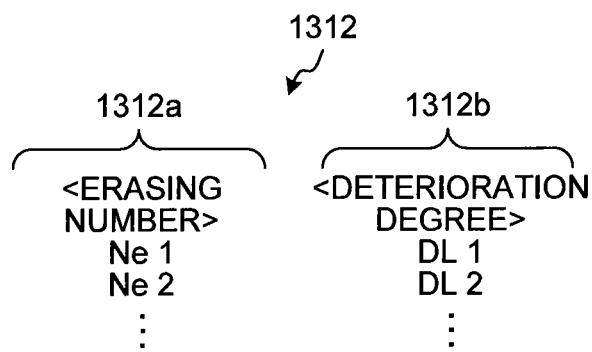

FIG. 6B illustrates the table 1312 which is acquired in advance experimentally and indicates a relation between the erasing number Ne and the deterioration degree. The table 1312 includes an erasing number 1312a and a deterioration degree column 1312b. The erasing number column 1312a records threshold values Ne1, Ne2, etc. used to determine the deterioration degree. The deterioration degree column 1312b records the deterioration degrees DL1, DL2, etc. listed by ranking or quantifying the deterioration progress of the NAND device over time in numeral terms. Referring to the table 1312, it can be determined that the deterioration degree of the NAND device reaches the deterioration degree DL1, for example, when the erasing number Ne monitored by the erasing number monitoring unit 122 is equal to or greater than the threshold value Ne1.

FIG. 7A illustrates a graph indicating a relation between a page writing moment (page program time) tProg and the writing/erasing number acquired in advance experimentally when it is assumed that the writing start voltage and the increase width of the writing voltage are an initial values Vws0 and ΔV0 (see FIG. 10), respectively. This graph represents an average of verification data for the plurality of physical pages. According to this graph, the writing time WT gradually decreases with an increase in the writing/erasing number. Accordingly, the deterioration degree of the block can be known from the writing time WT. The table 1313 obtained from the experiment result illustrated in FIG. 7A indicates that threshold value tProg1 of the writing time corresponds to threshold value Nw1 of the writing number Nw or the threshold value Ne1 of the erasing number Ne. Likewise, the changing information 131 also includes a table (not illustrated) obtained from a graph indicating a relation between the page writing moment tProg and the writing/erasing number acquired in advance experimentally for changed writing start voltages Vws1, Vws2, etc. described below. That is, referring to the tables 1311 to 1313 and the like, it can be determined that the deterioration degree of the NAND device reaches the deterioration degree DL1, for example, when the writing time WT monitored by the writing time monitoring unit 123 is equal to or less than threshold value tProg1. Further, the changing information 131 may include the experiment result itself illustrated in FIG. 7A, instead of the table 1313 acquired by the experiment result illustrated in FIG. 7A.

FIG. 7B illustrates a graph indicating a relation between an erasing time tBErase and the writing/erasing number acquired in advance experimentally when it is assumed that the erasing start voltage and the increase width of the erasing voltage are the initial values Ves0 and ΔVe0 (see FIG. 22B), respectively. This graph represents an average of the verification data for the plurality of physical pages. According to this graph, the erasing time ET gradually increases with an increase in the writing/erasing number. Accordingly, the deterioration degree of the block can be known from the erasing time ET. The table 1314 obtained from the experiment result illustrated in FIG. 7B indicates that a threshold value tBErase1 of a predetermined erasing time corresponds to the threshold value Nw1 of the writing number Nw or the threshold value Ne1 of the erasing number Ne. Likewise, the changing information 131 also includes a table (not illustrated) obtained from a graph indicating a relation between the erasing time tBErase and the writing/erasing number acquired in advance experimentally for changed erasing start voltages Ves1, Ves2, etc. described below. That is, referring to the tables 1311, 1312, 1314, and the like, it can be determined that the deterioration degree of the NAND device reaches the deterioration degree DL1, for example, when the erasing time ET monitored by the erasing time monitoring unit 124 is equal to or greater than the threshold value tBErase1. Further, the changing information 131 may include the experiment result itself illustrated in FIG. 7B, instead of the table 1314 acquired by the experiment result illustrated in FIG. 7B.

FIG. 8A illustrates a graph indicating a relation between the loop number Lwp at the page writing moment and the writing/erasing number acquired in advance experimentally when it is assumed that the writing start voltage and the increase width of the writing voltage are the initial values Vws0 and ΔV0 (see FIG. 10), respectively. This graph represents an average of verification data for the plurality of physical pages. According to this graph, the loop number Lwp at the page writing moment gradually decreases with an increase in the writing/erasing number. Accordingly, the deterioration degree of the block can be known from the loop number Lwp at the page writing moment. The table 1315 obtained from the experiment result illustrated in FIG. 8A indicates that a threshold value Lwp1 at the page writing moment corresponds to the threshold value Nw1 of the writing number Nw or the threshold value Ne1 of the erasing number Ne. Likewise, the changing information 131 also includes a table (not illustrated) obtained from a graph indicating a relation between the loop number Lwp at the page writing moment and the writing/erasing number acquired in advance experimentally for changed writing start voltages Vws1, Vws2, etc. described below. That is, referring to the tables 1311, 1312, 1315, and the like, it can be determined that the deterioration degree of the NAND device reaches the deterioration degree DL1, for example, when the loop number Lw at the writing time monitored by the writing loop number monitoring unit 125 is equal to or less than the threshold value Lwp1. Further, the changing information 131 may include the experiment result itself illustrated in FIG. 8A, instead of the table 1315 acquired by the experiment result illustrated in FIG. 8A.

FIG. 8B illustrates a graph indicating a relation between the loop number Le at the erasing moment and the writing/erasing number acquired in advance experimentally when it is assumed that the erasing start voltage and the increase width of the erasing voltage are the initial values Ves0 and ΔVe0 (see FIG. 22B), respectively. This graph represents an average of the verification data for the plurality of physical pages. According to this graph, the loop number Le at the erasing moment gradually increases with an increase in the writing/erasing number. Accordingly, the deterioration degree of the block can be known from the loop number Le at the erasing moment. The table 1316 obtained from the experiment result illustrated in FIG. 8B indicates that the threshold value Le1 of the loop number at the erasing moment corresponds to threshold value Nw1 of the writing number Nw or the threshold value Ne1 of the erasing number Ne. Likewise, the changing information 131 also includes a table (not illustrated) obtained from a graph indicating a relation between the loop number Le at the erasing moment and the writing/erasing number acquired in advance experimentally for changed erasing start voltages Vws1, Vws2, etc. described below. That is, referring to the tables 1311, 1312, 1316, and the like, it can be determined that the deterioration degree of the NAND device reaches the deterioration degree DL1, for example, when the loop number Le at the erasing moment monitored by the erasing loop number monitoring unit 126 is equal to or greater than the threshold value Le1. Further, the changing information 131 may include the experiment result itself illustrated in FIG. 8B, instead of the table 1316 acquired by the experiment result illustrated in FIG. 8B.

FIG. 9 illustrates a table 1317 used to determine the writing start voltage from the deterioration degree. The table 1317 includes a deterioration degree column 1317a and a writing start voltage column 1317b. The deterioration degree column 1317a records the deterioration degrees corresponding to the deterioration degrees recorded in the deterioration degree columns 1311b and 1312b of the tables 1311 and 1312 (see FIGS. 6A and 6B). The writing start voltage column 1317b records the writing start voltage values Vws1, Vws2, etc. to be changed which are determined in advance experimentally.

For example, the value Vws1 of the writing start voltage to be changed is a value, which is determined experimentally so that a writing time WT1 is substantially identical to a target value (initial value) WT0 when it is determined that the deterioration degree of the NAND device reaches the deterioration degree DL1, and is a value which is less than an initial value Vws0 of the writing start voltage.

For example, the writing start voltage value Vws2 to be changed is a value, which is determined experimentally so that a writing time WT2 is substantially identical to the target value (initial value) WT0 when it is determined that the deterioration degree of the NAND device reaches the deterioration degree DL2 (>DL1), and is a value which is less than the initial value Vws0 of the writing start voltage. Further, the writing start voltage value Vws2 to be changed is less than the writing start voltage value Vws1 to be changed.

Figure 10:
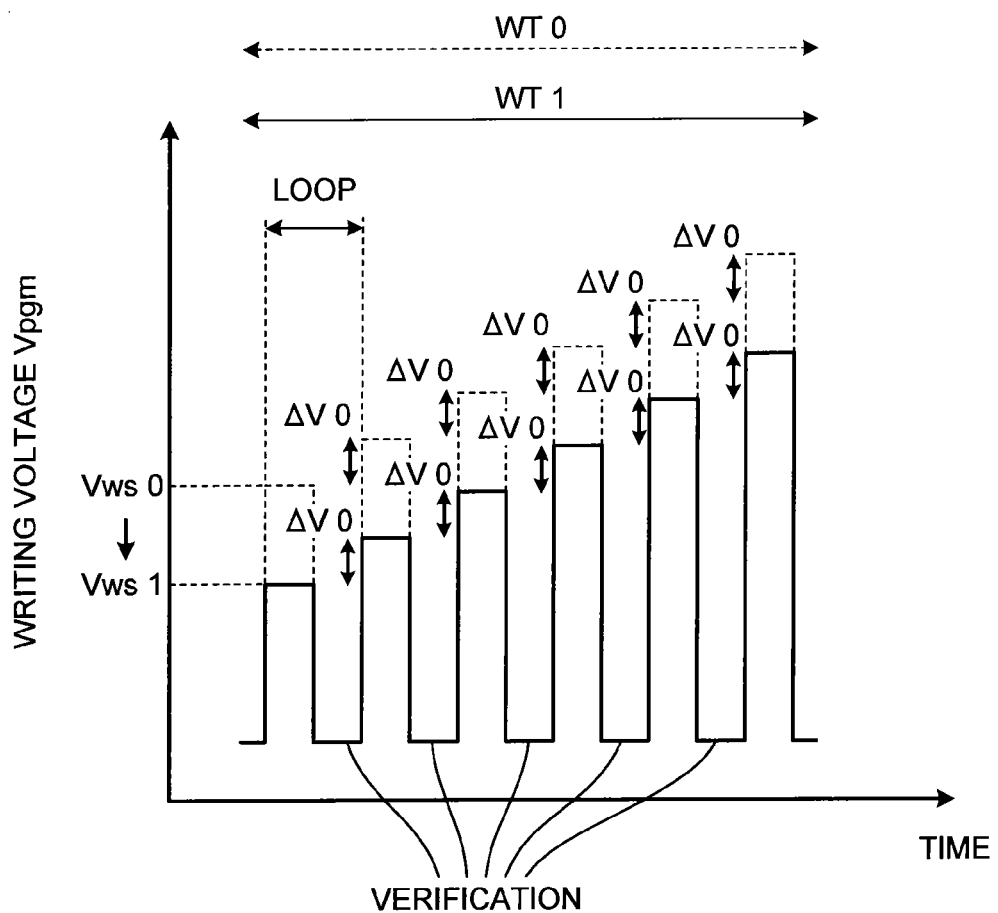
FIG. 10 is a diagram illustrating an operation of a writing process according to the first embodiment.

Referring to the changing information 131, the changing unit 13 lowers the value of the writing start voltage from the initial value Vws0 to the value Vws1, when the deterioration degree of the NAND device reaches deterioration degree DL1. In accordance with this lowering of the writing start voltage, the reading/writing control unit 11 performs the writing process using the writing start voltage Vws1 and the increase width ΔV0 of the writing voltage, as illustrated in FIG. 10. Thus, the writing time WT1 can be made to be substantially identical to the target value WT0.

As described above, in the first embodiment, the monitoring unit 12 monitors the characteristics of the processes of writing and erasing the data to and from the NAND device and the changing unit 13 determines the deterioration degree of the NAND device from the monitoring result. The changing unit 13 lowers the value of the writing start voltage in the writing process as the deterioration degree of the NAND device progresses. Thus, since an excess stress may not be made to be applied to the gate insulation film of each memory cell in the NAND device, a writing error (program disturb) at the writing time can be prevented from occurring. Further, since it is possible to reduce the stress to be applied to the gate insulation film of each memory cell in the NAND device, the deterioration of each memory cell itself can be suppressed and a reading error (read disturb) can be prevented from occurring, thereby improving a data holding characteristic (data retention). As a consequence, the reliability of the NAND device can be improved.

In the first embodiment, the changing unit 13 changes the writing start voltage in the writing process in accordance with the determination result of the deterioration degree and the changing information 131 so that the writing time WT is substantially identical to the target value WT0. That is, since it is possible to make the writing time WT substantially identical to the target value WT0, the performance of the NAND device can be made substantially constant.

Further, in the first embodiment, the changing unit 13 performs the process, for example, in the physical block unit. However, in a case of a process called wear leveling of evenly distributing data update portions and reducing a gap of the writing/erasing number of times between the blocks in the SSD 100A, the process of the changing unit 13 may be performed in a NAND chip unit or may be performed in the entire drive (the entire memory system).

First Modification of First Embodiment

The changing unit 13 may change the increase width of the writing voltage in the writing process, instead of changing the writing start voltage in the writing process. That is, the changing unit 13 may change the increase width of the writing voltage in the writing process in accordance with the determination result of the deterioration degree and the changing information 131 so that the writing time WT is substantially identical to the target value.

Figure 11:
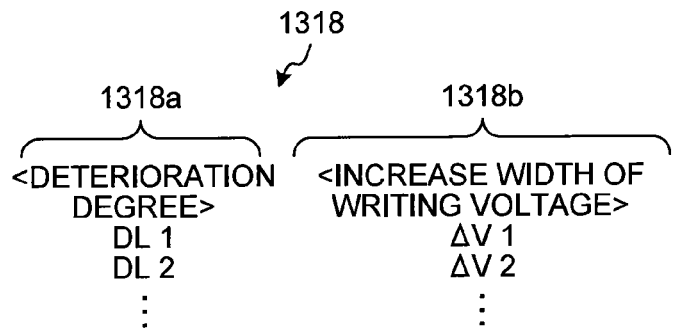
FIG. 11 is a diagram illustrating a data structure of change information according to a first modification of the first embodiment.

Specifically, the changing information 131 to which the changing unit 13 makes reference includes, for example, the tables 1311 to 1316 illustrated in FIGS. 6A to 8B, respectively, and used to determine the deterioration degree from the characteristics of the NAND device and the table 1318 illustrated in FIG. 11 and used to determine the increase width of the writing voltage from the deterioration degree. The changing information 131 does not include the table 1317 illustrated in FIG. 9.

FIG. 11 illustrates the table 1318 used to determine the increase width of the writing voltage from the deterioration degree. The table 1318 includes a deterioration degree column 1318a and a writing voltage increase width column 1318b. The deterioration degree column 1318a records deterioration degrees corresponding to the deterioration degrees recorded in the deterioration degree columns 1311b and 1312b of the tables 1311 and 1312 (see FIGS. 6A and 6B), respectively. The writing voltage increase width column 1318b records increase width values $\Delta V1$, $\Delta V2$, etc. of the writing voltages determined in advance experimentally as the increase width values to be changed.

For example, the increase width value $\Delta V1$ of the writing voltage to be changed is a value which is determined experimentally so that a writing time WT11 is substantially identical to the target value (initial value) WT0 when it is determined that the deterioration degree of the NAND device reaches the deterioration degree DL1. The increase width value $\Delta V1$ of the writing voltage is a value less than the initial value $\Delta V0$ of the increase width of the writing voltage.

For example, the increase width value $\Delta V2$ of the writing voltage to be changed is a value which is determined experimentally so that a writing time WT12 is substantially identical to the target value (initial value) WT0 when it is determined that the deterioration degree of the NAND device reaches the deterioration degree DL2 (>DL1). The increase width value $\Delta V2$ of the writing voltage is a value less than the initial value $\Delta V0$ of the increase width of the writing voltage. Further, the increase width value $\Delta V2$ of the writing voltage to be changed is a value less than the increase width value $\Delta V1$ of the writing voltage to be changed.

Figure 12:
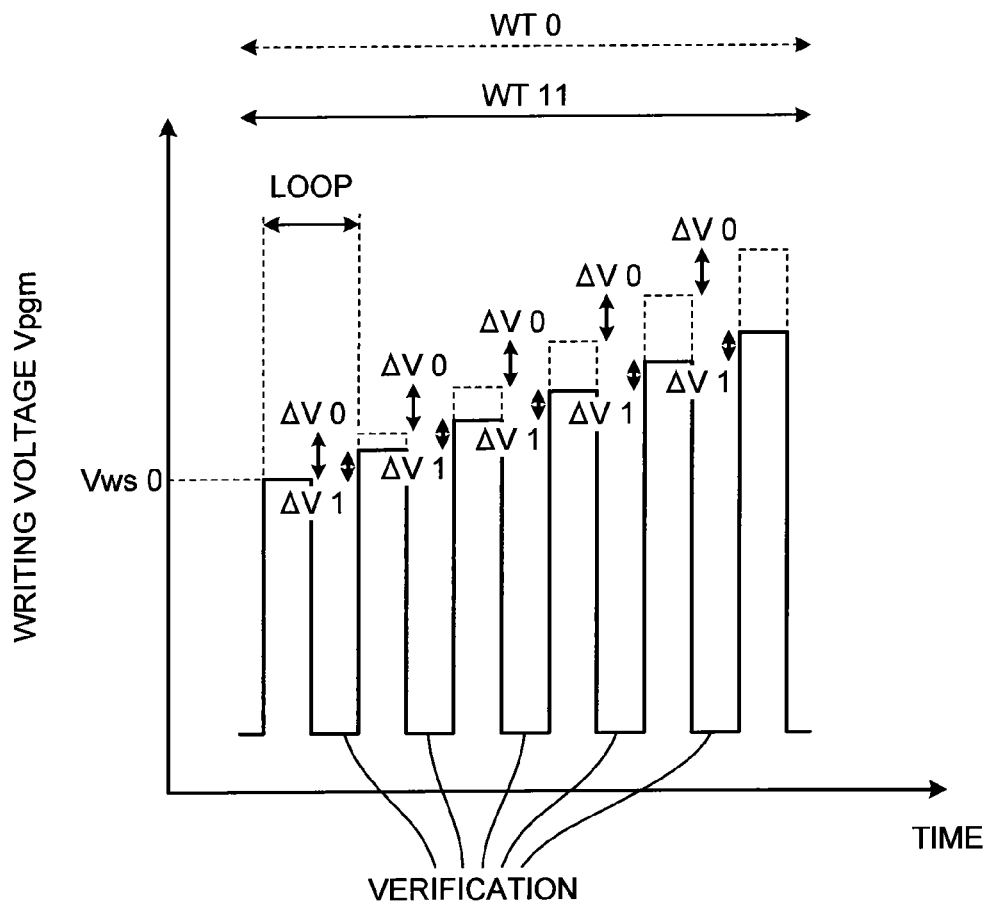
FIG. 12 is a diagram illustrating an operation of a writing process according to the first modification of the first embodiment.

Referring to the changing information 131, the changing unit 13 lowers the value of the increase width of the writing voltage in the writing process from the initial value $\Delta V0$ to the increase width value $\Delta V1$, when it is determined that the deterioration degree of the NAND device reaches the deterioration degree DL1. Accordingly, the reading/writing control unit 11 performs the writing process using the writing start voltage Vws0 and the increase width $\Delta V1$ of the writing voltage, as illustrated in FIG. 12. Thus, writing time WT11 can be made to be substantially identical to the target value WT0.

In the first modification of the first embodiment, since an excess stress may not be made to be applied to the gate insulation film of each memory cell in the NAND device, the reliability of the NAND device can be improved. That is, since it is possible to make the writing time WT substantially identical to the target value WT0, the performance of the NAND device can be made substantially constant.

Second Modification of First Embodiment

The changing unit 13 may change both the writing start voltage and the increase width of the writing voltage in the writing process. That is, the changing unit 13 may change both the writing start voltage and the increase width of the writing voltage in accordance with the determination result of the deterioration degree and the changing information 131 so that the writing time WT is substantially identical to the target value.

Specifically, the changing information 131 which the changing unit 13 refers to includes, for example, the tables 1311 to 1316 illustrated in FIGS. 6A to 8B, respectively, and used to determine the deterioration degree from the characteristics of the NAND device and the tables 1317 and 1318 illustrated in FIGS. 9 and 11, respectively, and used to make the writing time WT substantially identical to the target value. That is, the values to be changed, which are recorded in both the table 1317 illustrated in FIG. 9 and the table 1318 illustrated in FIG. 11, are adjusted in advance experimentally so that the writing time WT is substantially identical to the target value.

For example, a pair of value Vws1 of the writing start voltage to be changed and value $\Delta V1$ of the increase width of the writing voltage to be changed are a pair of values determined experimentally so that the writing time WT21 is substantially identical to the target value (initial value) WT0, when it is determined that the deterioration degree of the NAND device reaches the deterioration degree DL1. Further, the value Vws1 of the writing start voltage to be changed is a value less than the initial value Vws0 of the writing start voltage. The value $\Delta V1$ of the increase width of the writing voltage to be changed is a value less than the initial value $\Delta V0$ of the increase width of the writing voltage.

For example, a pair of value Vws2 of the writing start voltage to be changed and value $\Delta V2$ of the increase width of the writing voltage to be changed are a pair of values determined experimentally so that a writing time WT22 is substantially identical to the target value (initial value) WT0, when it is determined that the deterioration degree of the NAND device reaches the deterioration degree DL2 (>DL1). Further, the value Vws2 of the writing start voltage to be changed is a value less than the initial value Vws0 of the writing start voltage. The value $\Delta V2$ of the increase width of the writing voltage to be changed is a value less than the initial value $\Delta V0$ of the increase width of the writing voltage. Furthermore, the value Vws2 of the writing start voltage to be changed is a value less than the value Vws1 of the writing start voltage to be changed. The value $\Delta V2$ of the increase width of the writing voltage to be changed is a value less than the value $\Delta V1$ of the increase width of the writing voltage to be changed.

Figure 13:
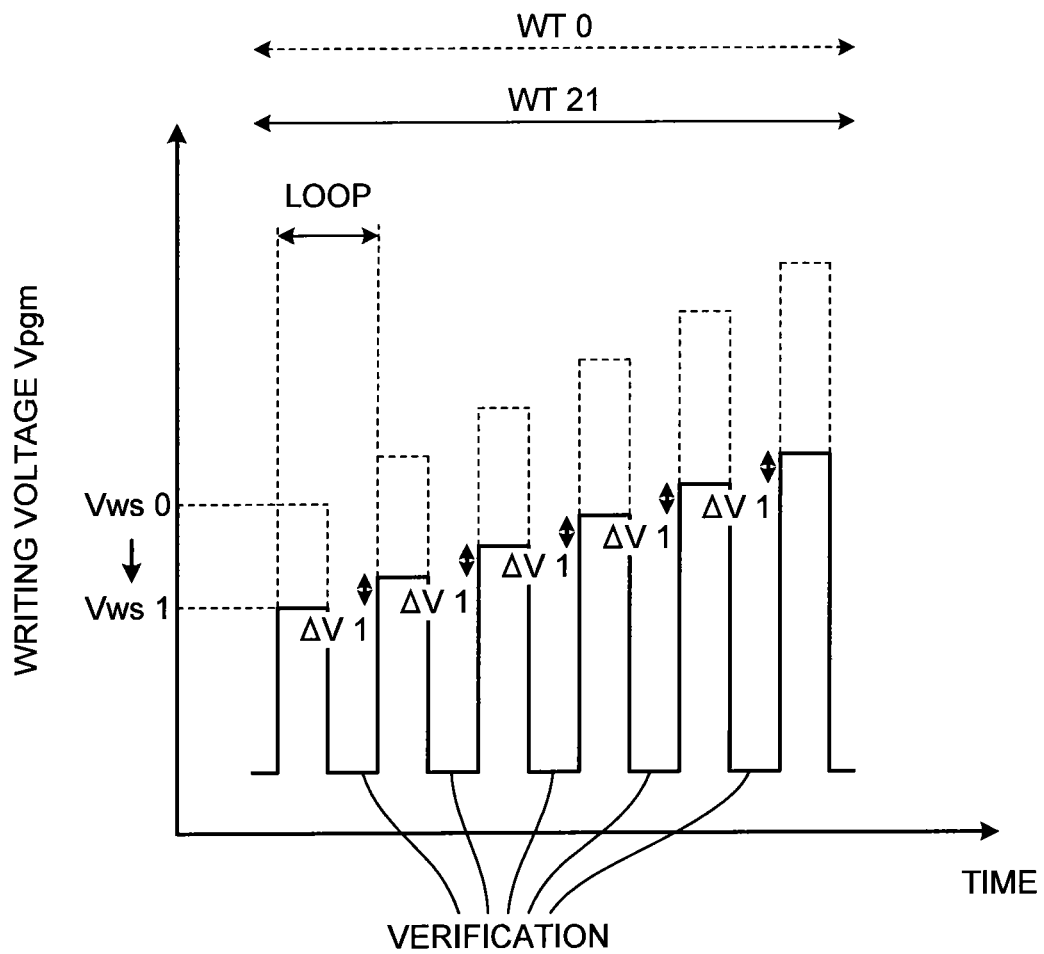
FIG. 13 is a diagram illustrating an operation of a writing process according to a second modification of the first embodiment.

Referring to the changing information 131, the changing unit 13 lowers the value of the writing start voltage in the wiring process from the initial value Vws0 to the value Vws1 and lowers the value of the increase width of the writing voltage from the initial value $\Delta V0$ to the increase width value $\Delta V1$, when it is determined that the deterioration degree of the NAND device reaches the deterioration degree DL1. Accordingly, the reading/writing control unit 11 performs the writing process using the writing start voltage Vws1 and the increase width $\Delta V1$ of the writing voltage, as illustrated in FIG. 13. Thus, the writing time WT21 can be made to be substantially identical to the target value WT0.

In the second modification of the first embodiment, since an excess stress may not be made to be applied to the gate insulation film of each memory cell in the NAND device, the reliability of the NAND device can be improved. That is, since it is possible to make the writing time WT substantially identical to the target value WT0, the performance of the NAND device can be made substantially constant.

Third Modification of First Embodiment

The changing unit 13 may change the verification voltage in addition to at least one of the writing start voltage and the increase width of the writing voltage in the writing process. Hereinafter, a case will be explained in which the changing unit 13 changes the verification voltage in addition to the writing start voltage. However, the same is applied to a case where the verification voltage is changed in addition to the increase width of the writing voltage or a case where the verification voltage is changed in addition to both the writing start voltage and the increase width of the writing voltage.

Figure 14:
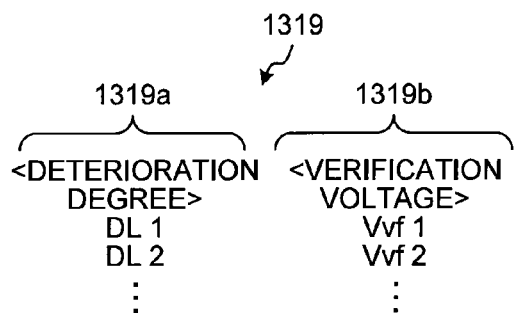
FIG. 14 is a diagram illustrating a data structure of change information according to a third modification of the first embodiment.

Specifically, the changing information 131 which the changing unit 13 refers to includes, for example, a table 1319 illustrated in FIG. 14 and used to determine the verification voltage from the deterioration degree in addition to the tables 1311 to 1316 illustrated in FIGS. 6A to 8B, respectively, and used to determine the deterioration degree from the characteristics of the NAND device and the table 1317 illustrated in FIG. 9 and used to determine the writing start voltage from the deterioration degree.

FIG. 14 illustrates the table 1319 used to determine the verification voltage from the deterioration degree. The table 1319 includes a deterioration degree column 1319a and a verification voltage column 1319b. The deterioration degree column 1319a records the deterioration degrees corresponding to the deterioration degrees recorded in the deterioration degree columns 1311b and 1312b of the tables 1311 and 1312 (see FIGS. 6A and 6B), respectively. The verification voltage column 1319b records values Vvf1, Vvf2, etc. of the verification voltages determined in advance experimentally as the values to be changed.

The values to be recorded in both the table 1317 illustrated in FIG. 9 and the table 1319 illustrated in FIG. 14 are adjusted in advance experimentally so that the writing time WT is substantially identical to the target value.

For example, a pair of value Vws1 of the writing start voltage to be changed and value Vvf1 of the verification voltage to be changed are a pair of values determined experimentally so that a writing time WT31 is substantially identical to the target value (initial value) WT0, when it is determined that the deterioration degree of the NAND device reaches the deterioration degree DL1. Further, the value Vws1 of the writing start voltage to be changed is a value less than the initial value Vws0 of the writing start voltage. The value Vvf1 of the verification voltage to be changed is a value less than the initial value Vvf0 of the value Vvf1 of the verification voltage.

For example, a pair of value Vws2 of the writing start voltage to be changed and value Vvf2 of the verification voltage to be changed are a pair of values determined experimentally so that a writing time WT32 is substantially identical to the target value (initial value) WT0, when it is determined that the deterioration degree of the NAND device reaches the deterioration degree DL2 (>DL1). Further, the value Vws1 of the writing start voltage to be changed is a value less than the initial value Vws0 of the writing start voltage. The value Vvf1 of the verification voltage to be changed is a value greater than the initial value Vvf0 of the value Vvf1 of the verification voltage. Furthermore, the value Vws2 of the writing start voltage to be changed is a value less than the value Vws1 of the writing start voltage to be changed. The value Vvf2 of the verification voltage to be changed is a value greater than the value Vvf1 of the verification voltage to be changed.

Figure 15:
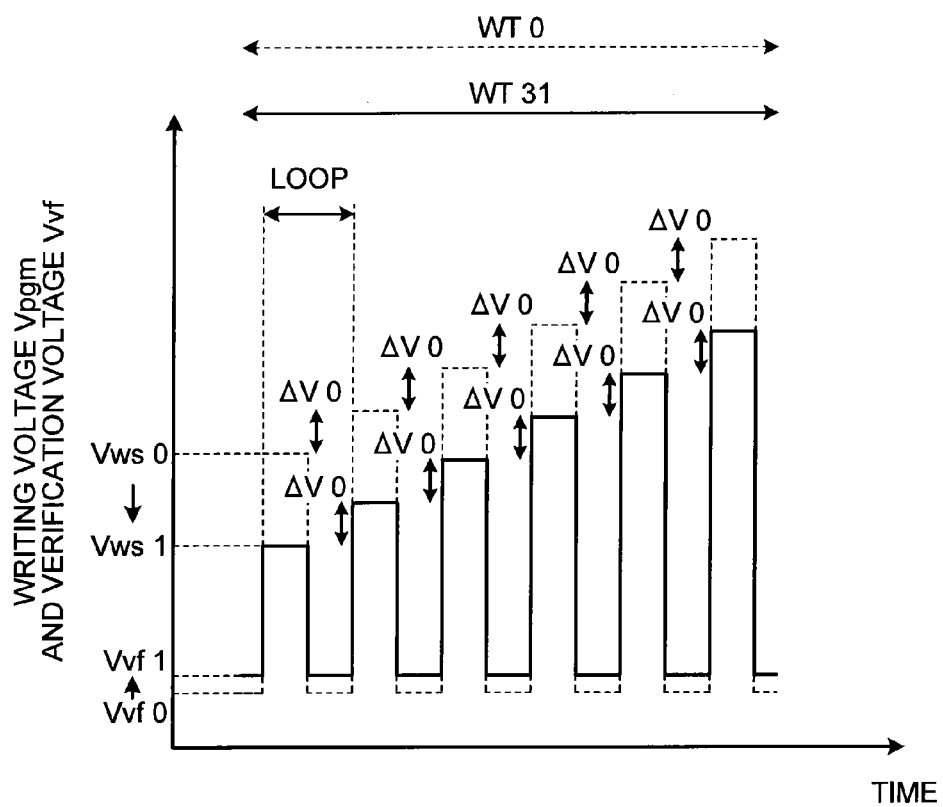
FIG. 15 is a diagram illustrating an operation of a writing process according to the third modification of the first embodiment.

Referring to the changing information 131, the changing unit 13 lowers the value of the writing start voltage in the writing process from the initial value Vws0 to the value Vws1 and raises the value of the verification voltage from the initial value Vvf0 to the value Vvf1, when it is determined that the deterioration degree of the NAND device reaches the deterioration degree DL1. Accordingly, the reading/writing control unit 11 performs the writing operation using the writing start voltage Vws1 and the increase width $\Delta V0$ of the writing voltage and the writing process including the verification operation using the verification voltage Vvf1, as illustrated in FIG. 15. Thus, the writing time WT31 can be made to be substantially identical to the target value WT0.

In the third modification of the first embodiment, since an excess stress may not be made to be applied to the gate insulation film of each memory cell in the NAND device, the reliability of the NAND device can be improved. That is, since it is possible to make the writing time WT substantially identical to the target value WT0, the performance of the NAND device can be made substantially constant.

Second Embodiment

Next, a memory system according to a second embodiment will be explained. The difference from the first embodiment will be mainly explained.

Figure 16:
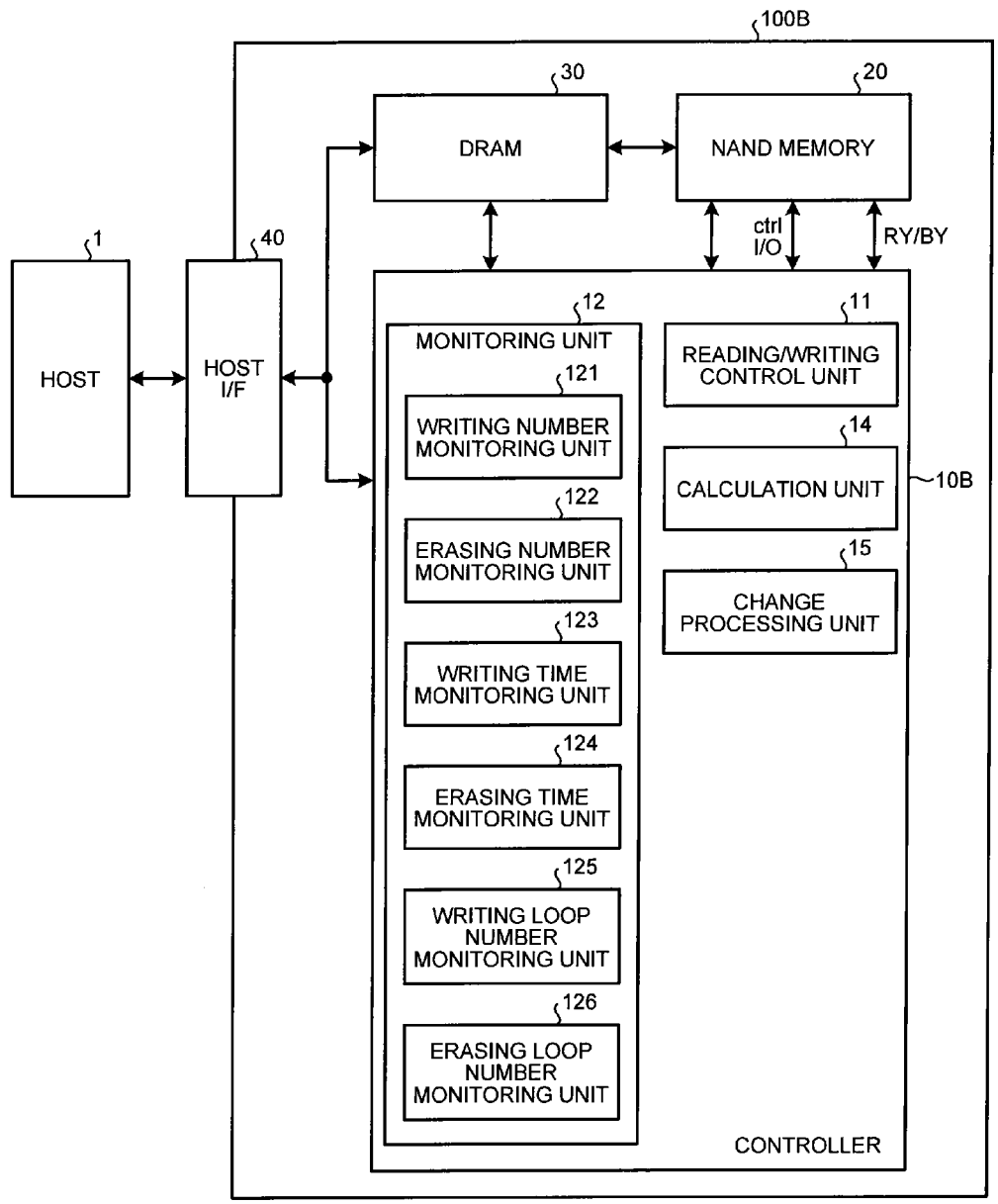
FIG. 16 is a diagram illustrating a functional configuration of a memory system according to a second embodiment.

In the second embodiment, feedback control is performed when the value of the writing start voltage is changed in accordance with the characteristics of the NAND device. Specifically, a controller 10B of an SSD 100B includes a calculation unit 14 and a change processing unit 15, as illustrated in FIG. 16.

The calculation unit 14 calculates a change amount of value of the writing start voltage in order to make the writing time WT substantially identical to the target value WT0 in accordance with the characteristics of the NAND device monitored by a monitoring unit 21. Specifically, for example, the calculation unit 14 includes a function indicating a relation between a deviation of the writing time WT from the target value WT0 and a change amount of writing start voltage for cancelling the deviation. The calculation unit 14 receives the monitoring result of the writing time WT from the writing time monitoring unit 123 and calculates a deviation $\Delta WT$ of the writing time WT from the target value WT0 of the monitoring result. The calculation unit 14 assigns the deviation $\Delta WT$ to the function, calculates the change amount of writing start voltage for cancelling the deviation $\Delta WT$, and supplies the variation amount of writing start voltage to a change processing unit 15.

The change processing unit 15 changes the value of the writing start voltage in the writing process by the use of the change amount calculated by the calculation unit 14. Specifically, the change processing unit 15 determines the voltage of the writing start voltage to be changed, from the current value of the writing start voltage and the change amount calculated by the calculation unit 14. Thus, when it is determined that the deterioration degree of the NAND device reaches the deterioration degree DL1, a changing unit 13 lowers the value of the writing start voltage in the writing process from the immediately previous value to the value Vws1. Accordingly, a reading/writing control unit 11 performs the writing process by the use of the writing start voltage Vws1 and the increase width $\Delta V0$ of the writing voltage, as illustrated in FIG. 10. Thus, the writing time WT1 can be made substantially identical to the target value WT0.

As described above, in the second embodiment, the changing unit 13 successively lowers the value of the writing start voltage in the writing process as the deterioration degree of the NAND device progresses. Accordingly, since it is possible to further reduce the stress applied to the gate insulation film of each memory cell in the NAND device, the reliability of the NAND device can efficiently be improved.

In the second embodiment, the changing unit 13 continuously changes the writing start voltage in the writing process in accordance with the determination result of the deterioration degree and the changing information 131 so that the writing time WT is substantially identical to the target value WT0. That is, since it is possible to successively make the writing time WT substantially identical to the target value WT0, the performance of the NAND device can further be made substantially constant.

Third Embodiment

Next, a memory system according to a third embodiment will be explained. The difference from the first embodiment will be mainly explained.

Figure 17:
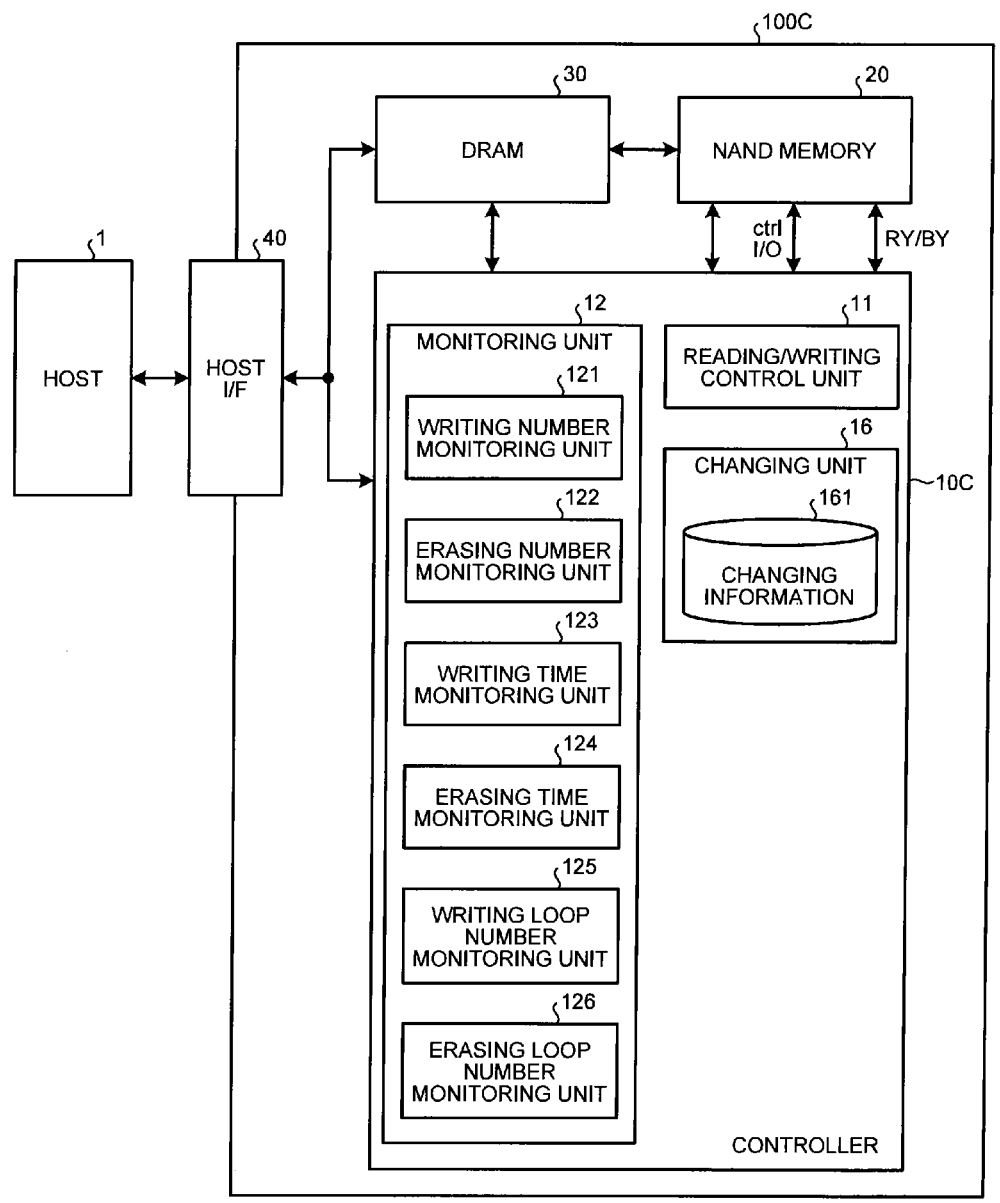
FIG. 17 is a diagram illustrating a functional configuration of a memory system according to a third embodiment.

In the third embodiment, a target to be changed in accordance with the characteristics of the NAND device is the value of the erasing start voltage in the erasing process. Specifically, a controller 10C of an SSD 100C includes a changing unit 16, as illustrated in FIG. 17.

The changing unit 16 compares the characteristics of the NAND device monitored by a monitoring unit 12, as described above, to a predetermined threshold value and determines the deterioration degree of each block of the NAND device in accordance with the comparison result and changing information 161. Further, the changing unit 16 changes the erasing start voltage in the erasing process in accordance with the determination result of the deterioration degree and the changing information 161 so that the erasing time ET is substantially identical to a target value. The changing unit 16 performs the process, for example, in the physical block unit.

Figure 18:
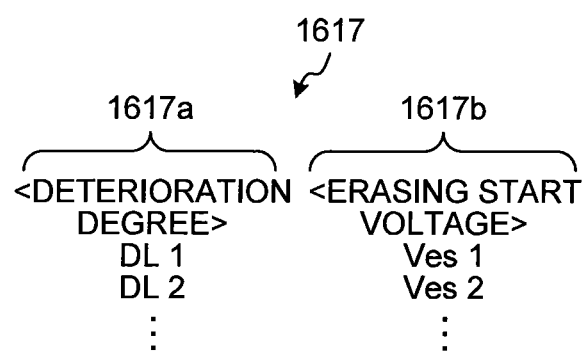
FIG. 18 is a diagram illustrating a data structure of change information according to the third embodiment.

Specifically, the changing information 161 which the changing unit 16 refers to includes, for example, the tables 1311 to 1316 illustrated in FIGS. 6A to 8B, respectively, and used to determine the deterioration degree from the characteristics of the NAND device and a table 1617 illustrated in FIG. 18 and used to determine the erasing start voltage from the deterioration degree.

FIG. 18 illustrates the table 1617 used to determine the erasing start voltage from the deterioration degree. The table 1617 includes a deterioration degree column 1617a and an erasing start voltage column 1617b. The deterioration degree column 1617a records the deterioration degrees corresponding to the deterioration degrees recorded in the deterioration degree columns 1311b and 1312b of the tables 1311 and 1312 (see FIGS. 6A and 6B), respectively. The erasing start voltage column 1617b records values Ves1, Ves2, etc. of the erasing start voltages determined in advance experimentally as the values to be changed.

For example, the value Ves1 of the erasing start voltage to be changed is a value determined experimentally so that an erasing time ET1 is substantially identical to the target value (initial value) ET0, when it is determined that the deterioration degree of the NAND device reaches the deterioration degree DL1. The value Ves1 of the erasing start voltage is a value greater than the initial value Ves0 of the erasing start voltage.

For example, the value Ves2 of the erasing start voltage to be changed is a value determined experimentally so that an erasing time ET2 is substantially identical to the target value (initial value) ET0, when it is determined that the deterioration degree of the NAND device reaches the deterioration degree DL2 (>DL1). The value Ves2 of the erasing start voltage to be changed is a value greater than the initial value Ves0 of the writing start voltage. Further, the value Ves2 of the erasing start voltage to be changed is a value greater than the value Ves1 of the writing start voltage to be changed.

Figure 19A:
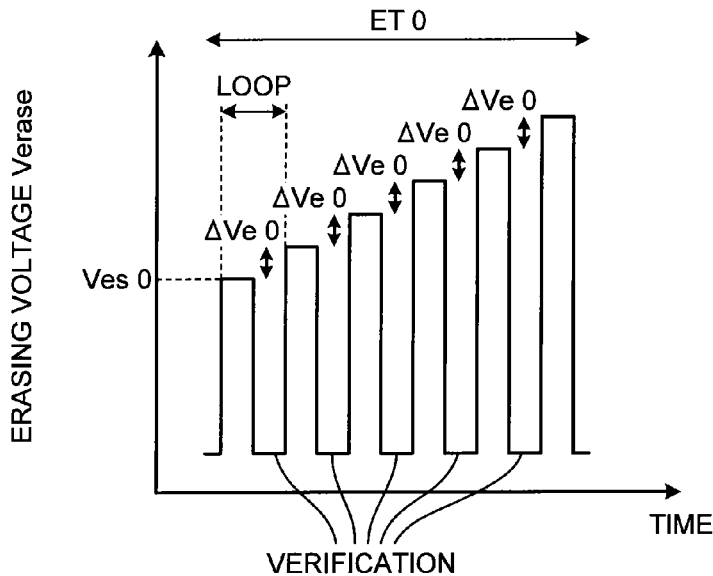
FIGS. 19A and 19B are diagrams illustrating an operation of an erasing process according to the third embodiment.
Figure 19B:
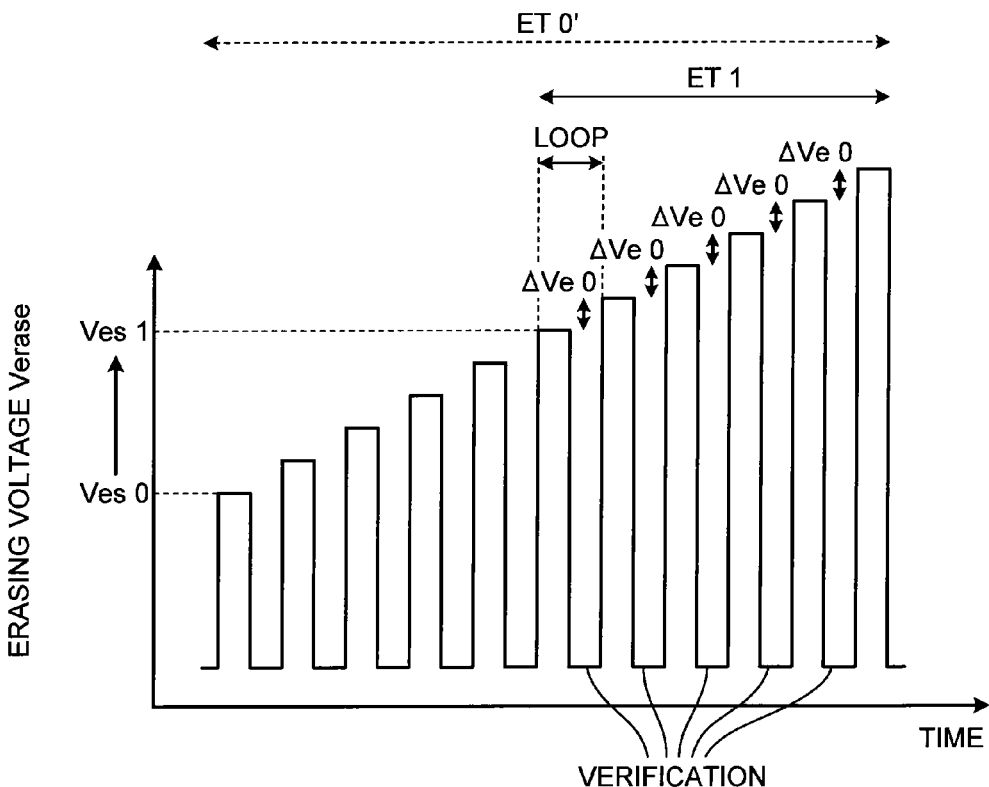

Referring to the changing information 161, the changing unit 16 raises the value of the erasing start voltage in the erasing process from the initial value Ves0 to the value Ves1, when it is determined that the deterioration degree of the NAND device reaches the deterioration degree DL1. Accordingly, a reading/writing control unit 11 performs the erasing process using the erasing start voltage Ves1 and the increase width ΔVe0 of the erasing voltage, as illustrated in FIG. 19B. Thus, the erasing time ET1 can be made to be substantially identical to the target value ET0.

Here, a case will be explained in which the value of the erasing start voltage in the erasing process is held to the initial value Ves0 irrespective of the deterioration degree. In this case, for example, in the initial state where the deterioration scarcely occurs, as illustrated in FIG. 19A, the number of times of loop at the erasing moment is, for example, 6 times and the erasing completion time is the erasing time ET0 in the erasing process of using the erasing start voltage Ves0 and the increase width ΔVe0 of the erasing voltage. However, when the deterioration progresses, the number of times of loop is increased to 11 times and an erasing time ET0' (>ET0) thus becomes longer in the erasing process of using the erasing start voltage Ves1 and the increase width ΔVe0 of the erasing voltage, as indicated by a dashed line and a solid line of FIG. 19B. Thus, since an excess stress is applied to the gate insulation film of each memory cell in the NAND device, the reliability of the NAND device tends to degrade.

Accordingly, in the third embodiment, the changing unit 16 gradually increases the value of the erasing start voltage in the erasing process as the deterioration degree of the NAND device progresses. Thus, since it is possible to reduce the number of times of loop and the erasing time, no excess stress can be applied to the gate insulation film of each memory cell in the NAND device. Therefore, the reliability of the NAND device can be improved.

In the third embodiment, the changing unit 16 changes the erasing start voltage in the erasing process in accordance with the determination result of the deterioration degree and the changing information 161 so that the erasing time ET is substantially identical to the target value ET0. That is, since it is possible to make the erasing time ET substantially identical to the target value ET0, the performance of the NAND device can be made substantially constant.

In the third embodiment, the changing unit 16 performs the process, for example, in the physical block unit. However, in a case of a process called wear leveling of evenly distributing data update portions and reducing a gap of the writing/erasing number of times between the blocks in the SSD 100C, the process of the changing unit 16 may be performed in a NAND chip unit or may be performed in the entire drive (the entire memory system).

First Modification of Third Embodiment

The changing unit 16 may change the erasing start voltage in the erasing process in accordance with the determination result of the deterioration degree and the changing information 161 so that the erasing time ET is less than the target value.

Figures 20A, 20B:
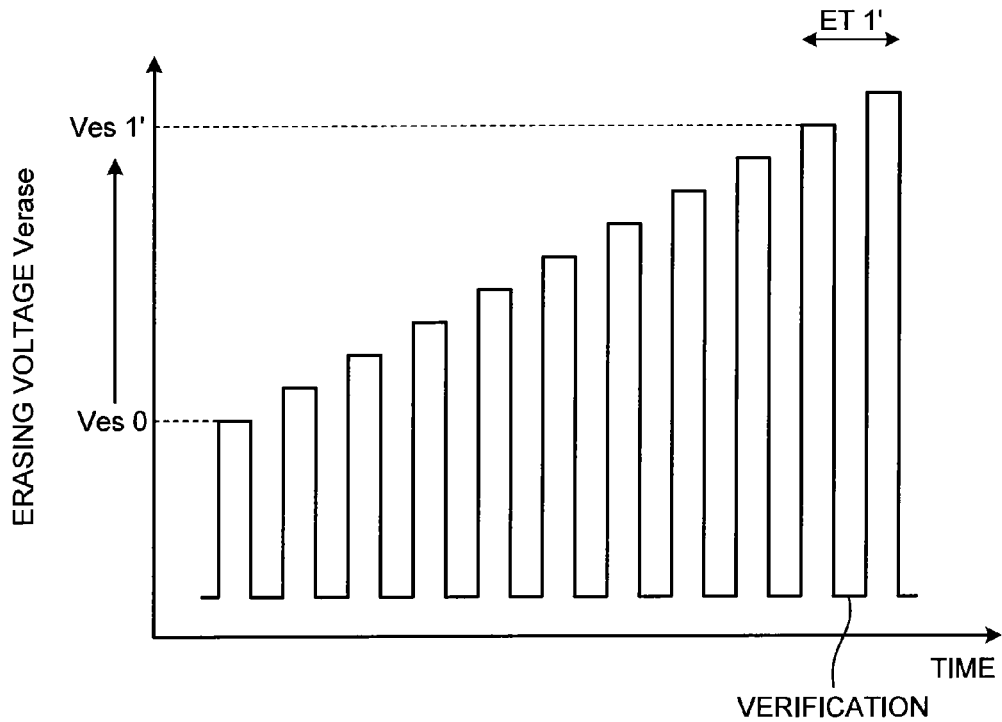
FIGS. 20A and 20B are diagrams illustrating an operation of an erasing process according to a first modification of the third embodiment.

For example, values Ves1', Ves2', etc. of the erasing start voltages to be changed, which are recorded in the table 1617 of the changing information 161, may be values determined experimentally so that the erasing time ET1' is less than the target value (initial value) ET0. In other words, the values Ves1', Ves2', etc. of the erasing start voltages to be changed, which are recorded in the table 1617 of the changing information 161, may be the values determined experimentally so that the number of times of loop at the erasing moment is twice. Referring to such changing information 161, the changing unit 16 raises the value of the erasing start voltage in the erasing process from the initial value Ves0 to the value Ves1', when it is determined that the deterioration degree of the NAND device reaches the deterioration degree DL1. Accordingly, the reading/writing control unit 11 performs the erasing process using the erasing start voltage Ves1' and the increase width ΔVe0 of the erasing voltage (see FIG. 19B), as illustrated in FIG. 20A. Thus, the erasing time ET1' can be made to be less than the target value ET0.

Alternatively, for example, values Ves1", Ves2", etc. of the erasing start voltages to be changed, which are recorded in the table 1617 of the changing information 161, may be the values determined experimentally so that an erasing time ET1" is less than the target value ET0. In other words, the values Ves1", Ves2", etc. of the erasing start voltages to be changed, which are recorded in the table 1617 of the changing information 161, may be the values determined experimentally so that the number of times of loop at the erasing moment is once. Referring to such changing information 161, the changing unit 16 raises the value of the erasing start voltage in the erasing process from the initial value Ves0 to the value Ves1", when it is determined that the deterioration degree of the NAND device reaches the deterioration degree DL1. Accordingly, the reading/writing control unit 11 performs the erasing process using the erasing start voltage Ves1" and the increase width ΔVe0 of the erasing voltage (see FIG. 19B), as illustrated in FIG. 20B. Thus, the erasing time ET1" can be made to be less than the target value ET0.

Second Modification of Third Embodiment

The changing unit 16 may change both the erasing start voltage and the increase width of the erasing voltage in the erasing process. That is, the changing unit 16 may change both the erasing start voltage and the increase width of the erasing voltage in accordance with the determination result of the deterioration degree and the changing information 161 so that the erasing time ET is equal to or less than the target value. Hereinafter, a case will be explained in which the erasing time ET is substantially identical to the target value, but the same is applied to a case where the erasing time ET is less than the target value.

Figure 21:
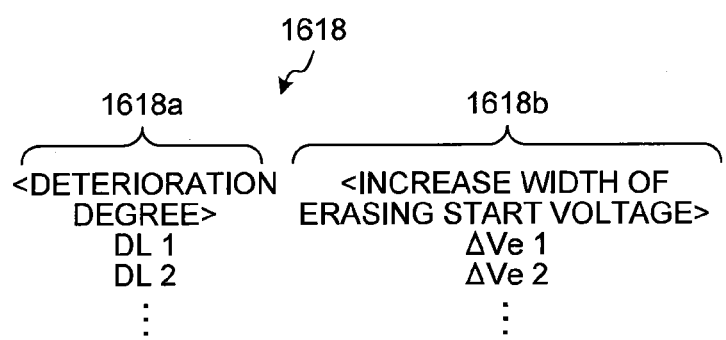
FIG. 21 is a diagram illustrating an operation of an erasing process according to a second modification of the third embodiment.

Specifically, the changing information 161 which the changing unit 16 refers to includes, for example, the tables 1311 to 1316 illustrated in FIGS. 6A to 8B, respectively, and used to determine the deterioration degree from the characteristics of the NAND device and the tables 1617 and 1618 illustrated in FIGS. 18 and 21, respectively, in order to make the erasing time ET substantially identical to the target value. That is, the values to be changed, which are recorded in both the table 1617 illustrated in FIG. 18 and the table 1618 illustrated in FIG. 21, are adjusted in advance experimentally so that the erasing time ET is substantially identical to the target value.

FIG. 21 illustrates the table 1618 used to determine the increase width of the erasing voltage from the deterioration degree. The table 1618 includes a deterioration degree column 1618a and an erasing voltage increase width column 1618b. The deterioration degree column 1618a records deterioration degrees corresponding to the deterioration degrees recorded in the deterioration degree columns 1311b and 1312b of the tables 1311 and 1312 (see FIGS. 6A and 6B), respectively. The erasing voltage increase width column 1618b records increase width values ΔVe1, ΔVe2, etc. of the erasing voltages determined in advance experimentally as the increase width values to be changed.

For example, a pair of value Ves1 of the erasing start voltage to be changed and value ΔVe1 of the increase width of the erasing voltage to be changed are a pair of values determined experimentally so that the erasing time ET11 is substantially identical to the target value (initial value) ET0, when it is determined that the deterioration degree of the NAND device reaches the deterioration degree DL1. Further, the value Ves1 of the erasing start voltage to be changed is a value greater than the initial value Ves0 of the erasing start voltage. The value ΔVe1 of the increase width of the erasing voltage to be changed is a value less than the initial value ΔVe0 of the increase width of the erasing voltage.

For example, a pair of value Ves2 of the erasing start voltage to be changed and value ΔVe2 of the increase width of the erasing voltage to be changed are a pair of values determined experimentally so that a erasing time ET22 is substantially identical to the target value (initial value) ET0, when it is determined that the deterioration degree of the NAND device reaches the deterioration degree DL2 (>DL1). Further, the value Ves2 of the erasing start voltage to be changed is a value greater than the initial value Ves0 of the erasing start voltage. The value ΔVe2 of the increase width of the erasing voltage to be changed is a value less than the initial value ΔVe0 of the increase width of the erasing voltage. Furthermore, the value Ves2 of the erasing start voltage to be changed is a value greater than the value Vws1 of the erasing start voltage to be changed. The value ΔVe2 of the increase width of the erasing voltage to be changed is a value less than the value ΔVe1 of the increase width of the erasing voltage to be changed.

Figure 22A:
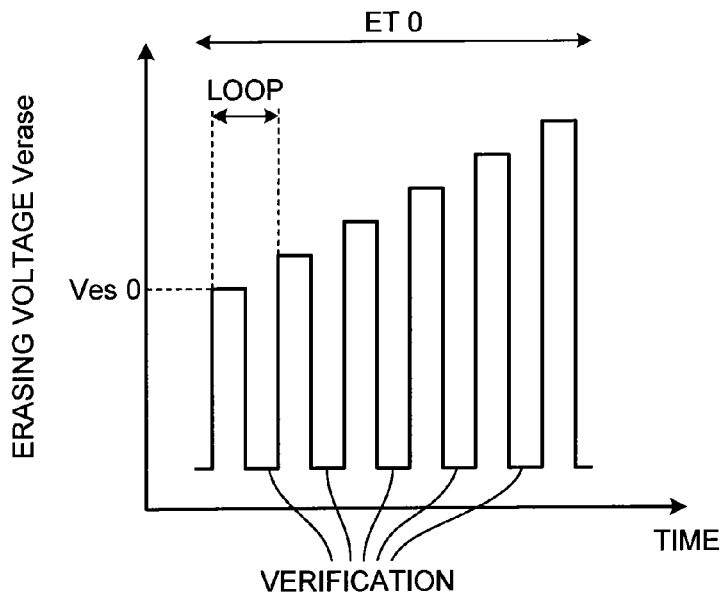
FIGS. 22A and 22B are diagrams illustrating an operation of the erasing process according to the second modification of the third embodiment.
Figure 22B:
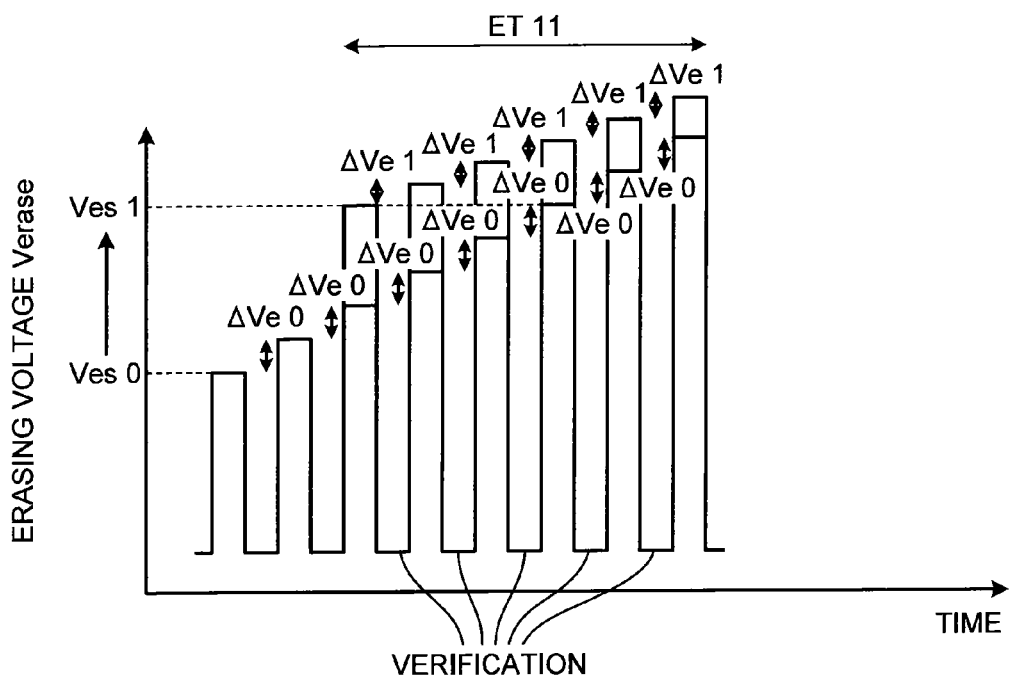

Referring to the changing information 161, the changing unit 16 raises the value of the erasing start voltage in the erasing process from the initial value Ves0 to the value Ves1 and lowers the value of the increase width of the erasing voltage from the initial value ΔVe0 to the increase width value ΔVe1, when it is determined that the deterioration degree of the NAND device reaches the deterioration degree DL1. Accordingly, the reading/writing control unit 11 performs the erasing process using the erasing start voltage Ves1 and the increase width ΔVe1 of the erasing voltage, as illustrated in FIG. 22B. Thus, the erasing time ET11 can be made to be substantially identical to the target value ET0 (see FIG. 22A).

In the second modification of the third embodiment, since an excess stress may not be made to be applied to the gate insulation film of each memory cell in the NAND device, the reliability of the NAND device can be improved. That is, since it is possible to make the erasing time ET substantially identical to the target value ET0, the performance of the NAND device can be made substantially constant.

Fourth Embodiment

Next, a memory system according to a fourth embodiment will be explained. The difference from the first embodiment will be mainly explained.

In the fourth embodiment, the verification operation of the writing process is changed from a normal type to a QPW (quick pass write) type in accordance with the characteristics of the NAND device.

Figure 23:
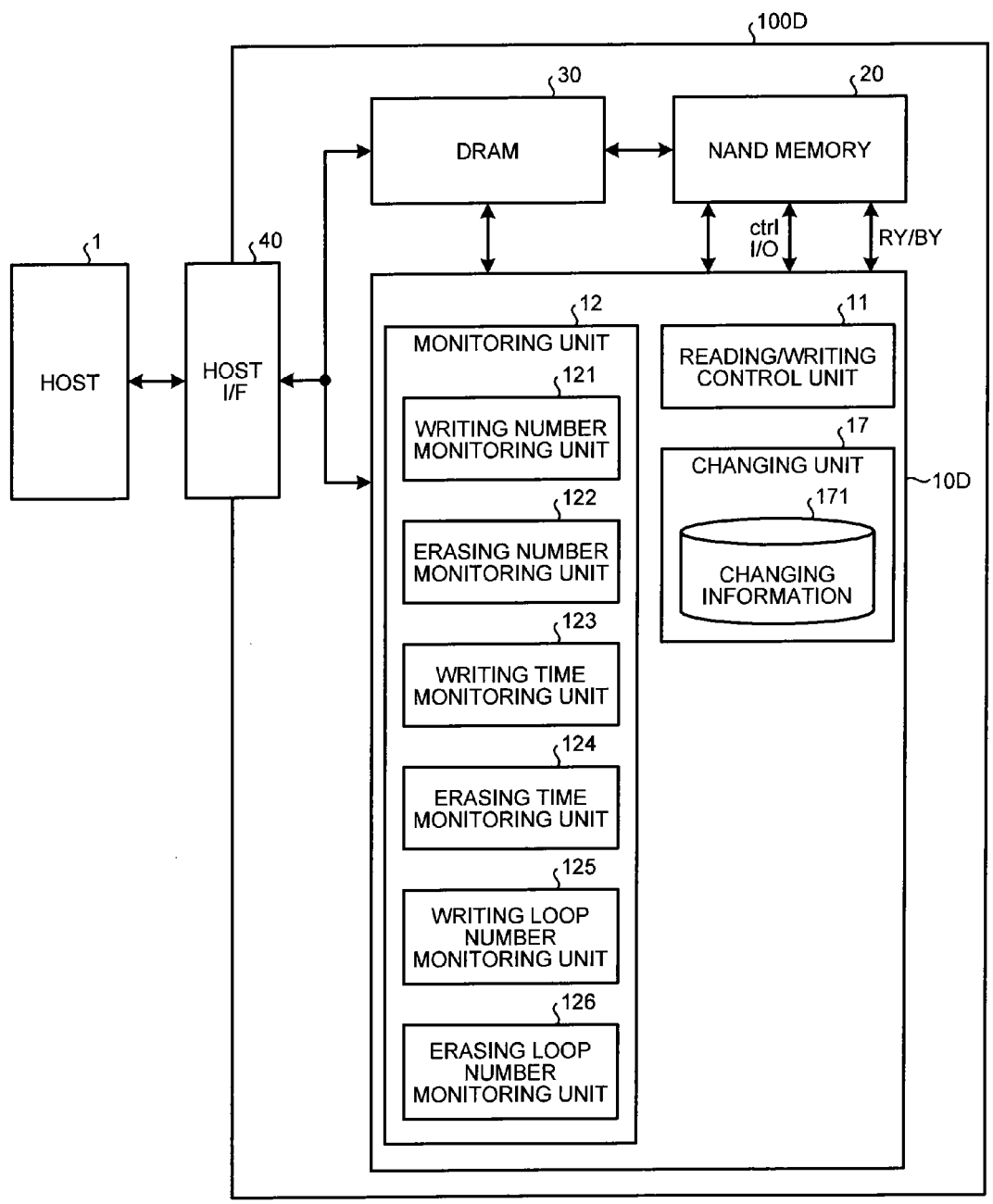
FIG. 23 is a diagram illustrating a functional configuration of a memory system according to a fourth embodiment.

Specifically, a controller 10D of an SSD 100D includes a changing unit 17, as illustrated in FIG. 23. The changing unit 17 compares the characteristics of the NAND device monitored by a monitoring unit 12, as described above, to a predetermined threshold value and determines the deterioration degree of each block of the NAND device in accordance with the comparison result and changing information 171. Further, the changing information 171 which the changing unit 17 refers to includes, for example, the tables 1311 to 1316 illustrated in FIGS. 6A to 8B, respectively, and used to determine the deterioration degree from the characteristics of the NAND device.

Then, the changing unit 17 changes the verification operation of the writing process from the normal type to the QPW type to perform the verification operation in accordance with the determination result of the deterioration degree. In the normal type, the verification operation is performed at a verification voltage Vvf0 in one step (see FIG. 15). On the other hand, in the QPW type, the verification operation is performed at a first verification voltage Vvf10 lower than the verification voltage Vvf0 of the normal type and at a second verification voltage Vvf21 equal to the verification voltage Vvf0 of the normal type in two steps.

Figure 26:
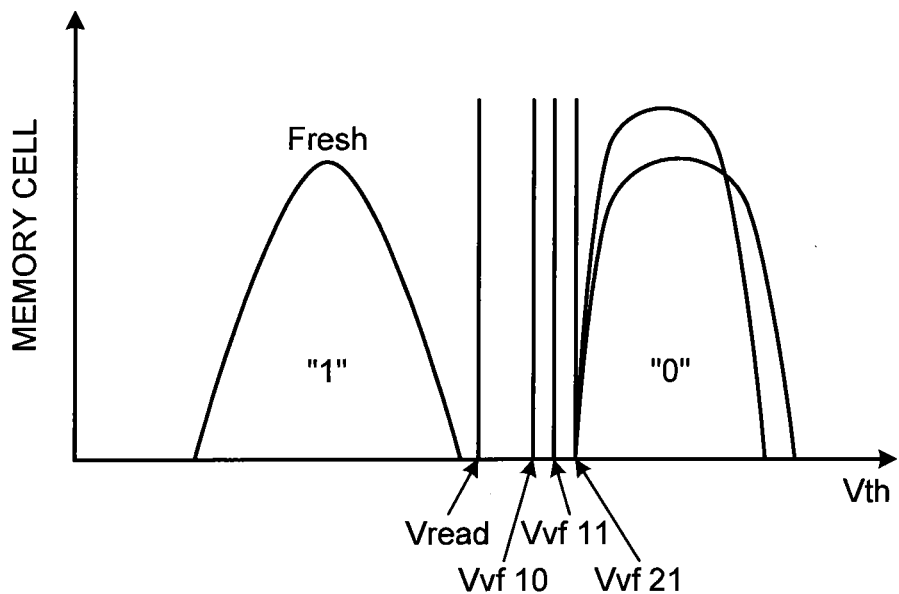
FIG. 26 is a diagram illustrating an advantage of the first modification of the fourth embodiment.

In a first step, the bit lines are first charged at a high level and the bit lines are applied with the first verification voltage Vvf10 lower than the verification voltage of the normal type. Thereafter, the selection gate line SGD (see FIG. 2A) is set to a high level and the charged bit lines are discharged. At this time, the potential of the bit lines corresponding to the writing uncompleted memory cells (memory cells in which a threshold value is located left than Vvf10 indicated by a dashed line in FIG. 26) is in a low level, whereas the potential of the bit lines corresponding to the QPW processing memory cells (memory cells in which the threshold value is located between Vvf10 indicated by a dashed line and Vvf21 indicated by a solid line in FIG. 26) and the writing completed memory cells (memory cells in which a threshold value is located right than Vvf21 indicated by a dashed line in FIG. 26) is in a high level. In this way, verification of the first step is performed.

In a second step, the word lines are applied with the second verification voltage Vvf21 substantially equal to the verification voltage of the normal type. At this time, the potential of the bit lines corresponding to the writing uncompleted memory cells and the QPW processing memory cells is in the low level, whereas the potential of the bit lines corresponding to the writing completed memory cells is in the high level. In this way, verification of the second step is performed.

Based on the verification result of the first step and the verification result of the second step, it can be understood whether the memory cells to be verified are in a state where the writing has not yet been completed, a state where the QPW is in processing, or a state where the writing has been completed. That is, when the potential of the bit lines in the first and second steps is the low level, the memory cells are in the state where the writing has not yet been completed. When the potentials of the bit lines in the first and second steps are the high level and the low level, respectively, the memory cells are in the state where the QPW is in processing. When the potential of the bit lines in the first and second steps is the high level, the memory cells are in the state where the writing has been completed.

Figure 28:
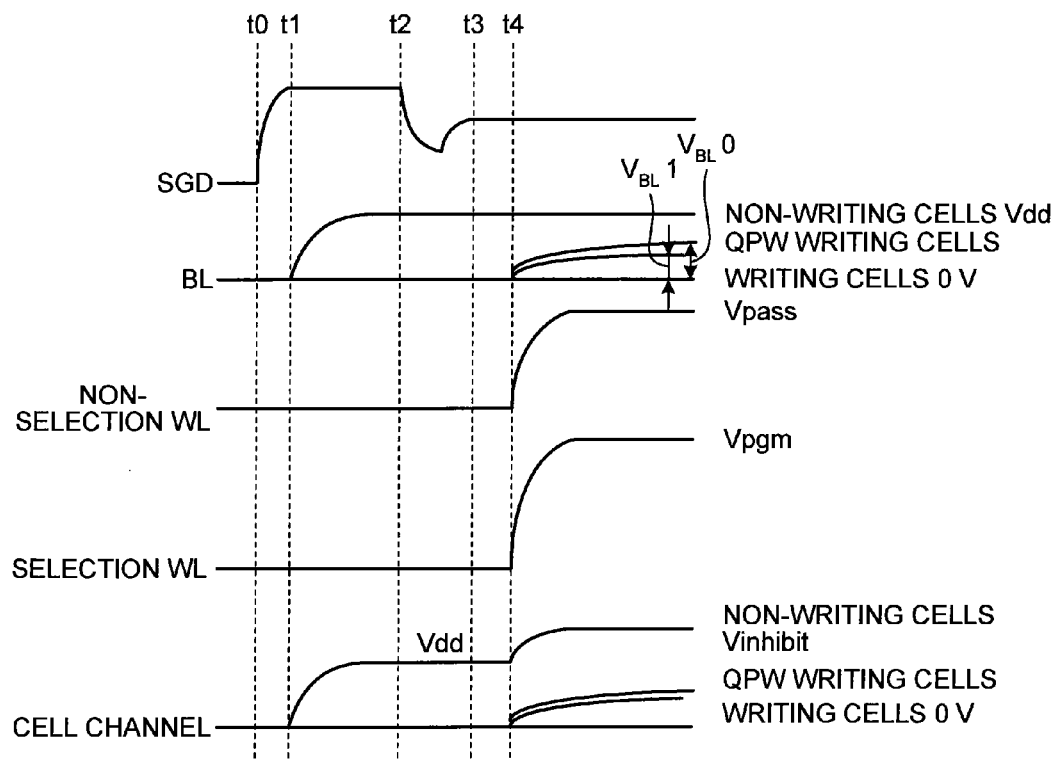
FIG. 28 is a diagram illustrating an operation of a writing process according to the second modification of the fourth embodiment.

When the memory cells to be verified are in the state where the writing has not yet been completed, the bit lines are subjected to the writing operation at a grounding voltage (0 V). That is, as indicated by a two-dot chain line in FIG. 28, the bit lines are held at the grounding voltage (0 V) during a period after t0. The selection gate line SGD is charged with a predetermined voltage during a period of t0 and t1, the selection gate line SGD is held at a predetermined voltage during a period of t1 to t2, the selection gate line SGD is discharged during a period of t2 and t3 and is charged with a voltage lower than the predetermined voltage, and the selection gate line SGD is held at the voltage during a period subsequent to t3. The selection word lines are subjected to writing during a period subsequent to t4 and are charged with a voltage Vpgm and the non-selection word lines are charged with a voltage Vpass.

When the memory cells to be verified are in the state where the QPW is in processing, the bit lines are charged with a charging voltage $V_{BL}0$ (>0 V) and the writing operation is performed by suppressing the writing speed. As indicated by a dashed line in FIG. 28, the bit lines are charged with the charging voltage $V_{BL}0$ during the period subsequent to t4. The selection word lines are charged with the writing voltage Vpgm during the period subsequent to t4 and the non-selection word lines are changed with a voltage Vpass.

When the memory cells to be verified are in the state where the writing has been completed, the bit lines as the non-writing cells are not subjected to the subsequent writing operation, for example, at a power supply voltage Vdd. That is, as indicated by a one-dot chain line in FIG. 28, the bit lines are charged with the power supply voltage Vdd after t1 and are held at the power supply voltage Vdd. The selection word lines are charged with the writing voltage Vpgm during the period subsequent to t4 and the non-selection word lines are changed with the voltage Vpass.

As described above, in the fourth embodiment, the changing unit 17 performs the verification operation in the writing process from the normal type to the QPW type in accordance with the determination result of the deterioration degree. That is, the changing unit 17 changes the verification operation from the normal type to the QPW type in the writing process and performs the verification operation as the deterioration degree of the NAND device progresses. According to the QPW type, since it is possible to decrease the writing speed of the memory cells (that is, the memory cells in the state of the QPW type) in which the threshold value is near the second verification voltage Vvf21, the width of a threshold distribution (distribution indicated by the solid line in FIG. 26) of the memory cell in the NAND device can be narrowed more than the width of a threshold distribution (distribution indicated by a one-dot chain line in FIG. 26) by the normal type. Thus, the reliability of the NAND device can be improved.

First Modification of Fourth Embodiment

The changing unit 17 may change the level of the first verification voltage in the QPW type of verification operation in accordance with the characteristics of the NAND device monitored by the monitoring unit 12 so that the writing time WT is substantially identical to the target value.

Figure 24:
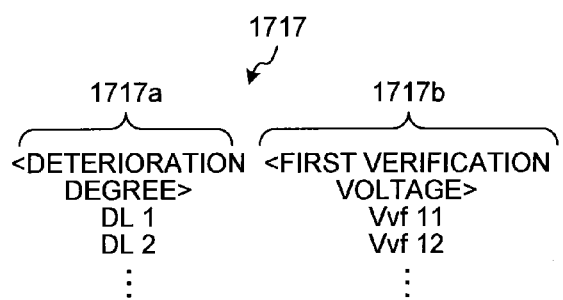
FIG. 24 is a diagram illustrating a data structure of change information according to a first modification of the fourth embodiment.

Specifically, the changing information 171 which the changing unit 17 refers to includes, for example, the table 1717 illustrated in FIG. 24 and used to determine the first verification voltage from the deterioration degree in addition to the tables 1311 to 1316 illustrated in FIGS. 6A to 8B, respectively, and used to determine the deterioration degree from the characteristics of the NAND device.

FIG. 24 illustrates the table 1717 used to determine the first verification voltage from the deterioration degree. The table 1717 includes a deterioration degree column 1717*a* and a first verification voltage column 1717*b*. The deterioration degree column 1717*a* records the deterioration degrees corresponding to the deterioration degrees recorded in the deterioration degree columns 1311*b* and 1312*b* of the tables 1311 and 1312 (see FIGS. 6A and 6B), respectively. The first verification voltage column 1717*b* records values Vvf11, Vvf12, etc. of the first verification voltages determined in advance experimentally as the values to be changed.

The values to be recorded in the table 1717 illustrated in FIG. 24 are adjusted in advance experimentally so that the writing time WT is substantially identical to the target value. For example, the value Vvf11 of the first verification voltage to be changed is a pair of values determined experimentally so that a writing time WT41 is substantially identical to the target value (initial value) WT0, when it is determined that the deterioration degree of the NAND device reaches the deterioration degree DL1. Further, the value Vvf11 of the first verification voltage to be changed is a value greater than the initial value Vvf10 of the first verification voltage.

For example, the value Vvf12 of the first verification voltage to be changed is a pair of values determined experimentally so that a writing time WT42 is substantially identical to the target value (initial value) WT0, when it is determined that the deterioration degree of the NAND device reaches the deterioration degree DL2. Further, the value Vvf12 of the first verification voltage to be changed is a value greater than the initial value Vvf10 of the first verification voltage. Further, the value Vvf12 of the first verification voltage to be changed is a value greater than the value Vvf11 of the first verification voltage to be changed.

Figure 25:
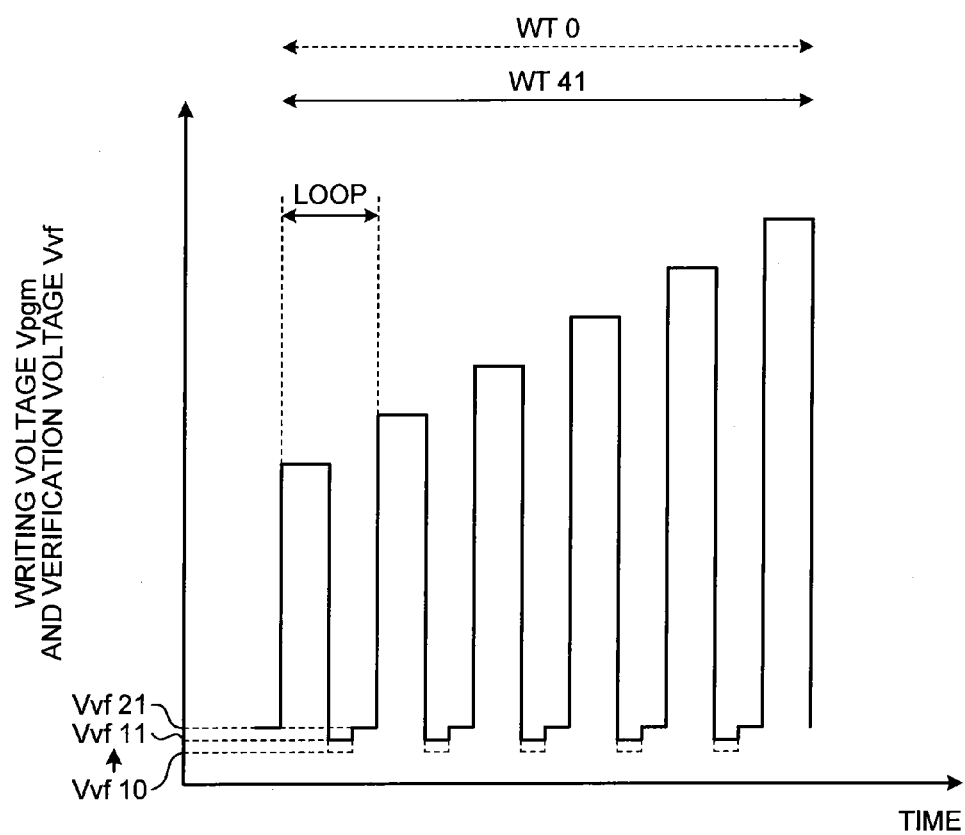
FIG. 25 is a diagram illustrating an operation of a writing process according to the first modification of the fourth embodiment.

Referring to the changing information 171, the changing unit 17 raises the value of the first verification voltage in the verification operation of the writing operation from the initial value Vvf10 to the value Vvf11, when it is determined that the deterioration degree of the NAND device reaches the deterioration degree DL1. Accordingly, the reading/writing control unit 11 performs the writing process including the verification operation using the first verification voltage Vvf11 and the second verification voltage Vvf21, as illustrated in FIG. 25. Thus, the writing time WT41 can be made to be substantially identical to the target value WT0.

In the first modification of the fourth embodiment, since it is possible to narrow the width of the threshold distribution of the memory cells in the NAND device, the reliability of the NAND device can be improved. That is, since it is possible to make the writing time WT substantially identical to the target value WT0, the performance of the NAND device can be made substantially constant.

Second Modification of Fourth Embodiment

The changing unit 17 may change the charging voltage of the bit lines in the QPW type of verification operation in accordance with the characteristics of the NAND device monitored by the monitoring unit 12 so that the writing time WT is substantially identical to the target value.

Figure 27:
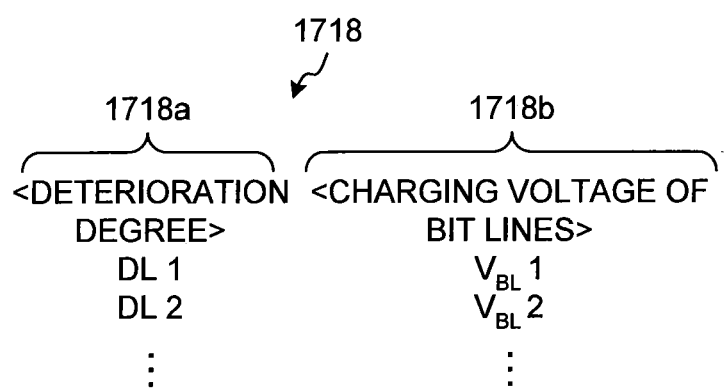
FIG. 27 is a diagram illustrating a data structure of change information according to a second modification of the fourth embodiment.

Specifically, the changing information 171 which the changing unit 17 refers to includes, for example, the table 1718 illustrated in FIG. 27 and used to determine the charging voltage of the bit lines from the deterioration degree in addition to the tables 1311 to 1316 illustrated in FIGS. 6A to 8B, respectively, and used to determine the deterioration degree from the characteristics of the NAND device.

FIG. 27 illustrates the table 1718 used to determine the charging voltage of the bit lines from the deterioration degree. The table 1718 includes a deterioration degree column 1718a and a bit line charging voltage column 1718b. The deterioration degree column 1718a records the deterioration degrees corresponding to the deterioration degrees recorded in the deterioration degree columns 1311b and 1312b of the tables 1311 and 1312 (see FIGS. 6A and 6B), respectively. The bit line charging voltage column 1718b records values $V_{BL}1$, $V_{BL}2$, etc. of the charging voltage of the bit lines determined in advance experimentally as the values to be changed.

The values to be recorded in the table 1718 illustrated in FIG. 27 are adjusted in advance experimentally so that the writing time WT is substantially identical to the target value.

For example, the value $V_{BL}1$ of the charging voltage of the bit lines to be changed is a pair of values determined experimentally so that a writing time WT51 is substantially identical to the target value (initial value) WT0, when it is determined that the deterioration degree of the NAND device reaches the deterioration degree DL1. Further, the value $V_{BL}1$ of the charging voltage of the bit lines to be changed is a value less than the initial value $V_{BL}0$ of the charging voltage of the bit lines (see FIG. 28).

For example, the value $V_{BL}2$ of the charging voltage of the bit lines to be changed is a pair of values determined experimentally so that a writing time WT52 is substantially identical to the target value (initial value) WT0, when it is determined that the deterioration degree of the NAND device reaches the deterioration degree DL2. Further, the value $V_{BL}2$ of the charging voltage of the bit lines to be changed is a value less than the initial value $V_{BL}0$ of the charging voltage of the bit lines. Further, the value $V_{BL}2$ of the charging voltage of the bit lines to be changed is a value greater than the value $V_{BL}1$ of the charging voltage of the bit lines to be changed.

Referring to the changing information 171, the changing unit 17 lowers the value of the charging voltage of the bit lines in the verification operation of the writing operation from the initial value $V_{BL}0$ to the value $V_{BL}1$, when it is determined that the deterioration degree of the NAND device reaches the deterioration degree DL1. Accordingly, the reading/writing control unit 11 performs the writing process including the verification operation using the value $V_{BL}1$ of the charging voltage of the bit lines. Thus, the writing time WT51 can be made to be substantially identical to the target value WT0.

In the second modification of the fourth embodiment, since it is possible to narrow the width of the threshold distribution of the memory cells in the NAND device, the reliability of the NAND device can be improved. That is, since it is possible to make the writing time WT substantially identical to the target value WT0, the performance of the NAND device can be made substantially constant.

Further, the first and second modifications of the fourth embodiment may be combined. Specifically, the changing information 171 which the changing unit 17 refers to may include, for example, the table 1717 illustrated in FIG. 24 and the table 1718 illustrated in FIG. 27, which are used to make the writing time WT substantially identical to the target value in addition to the tables 1311 to 1316 illustrated in FIGS. 6A to 8B, respectively, and used to determine the deterioration degree from the characteristics of the NAND device. That is, the values to be changed, which are recorded in both the table 1717 illustrated in FIG. 24 and the table 1718 illustrated in FIG. 27 are adjusted in advance experimentally so that the writing time WT is substantially identical to the target value.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
  a non-volatile memory device including a plurality of memory cells each of which stores data;
  a monitoring unit which monitors a characteristic of the non-volatile memory device when writing and erasing processes are performed to write and erase the data to and from the non-volatile memory device; and
  a changing unit which changes at least one of a value of a writing start voltage and an increase width of a writing voltage in the writing process in accordance with the monitored characteristic, the writing process being a process in which a writing operation and a verification operation are alternately repeated,
  wherein the memory system applies, when performing the writing operation, a first voltage to a first bit line connected to a first write memory cell, a second voltage higher than the first voltage to a second bit line connected to a second write memory cell, a third voltage higher than the second voltage to a third bit line connected to a non-write memory cell, according to a result of the verification operation, and the changing unit changes the second voltage according to the monitored characteristic of the non-volatile memory device.

2. The memory system according to claim 1, wherein the monitored characteristic of the non-volatile memory device includes at least one of a frequency of the writing process, a frequency of the erasing process, a time necessary for the writing process, a time necessary for the erasing process, a repeat count of the writing operation and the verification operation in the writing process, and a repeat count of an erasing operation and a verification operation in the erasing process.

3. The memory system according to claim 1, wherein the changing unit gradually changes at least one of the value of the writing start voltage and the increase width of the writing voltage in the writing process, in accordance with the monitored characteristic of the non-volatile memory device.

4. The memory system according to claim 3, wherein the monitoring unit determines a variation in the monitored characteristic of the non-volatile memory device step by step, and wherein the changing unit gradually changes at least a value of an erasing start voltage in the erasing process in accordance with a result determined by the monitoring unit.

5. The memory system according to claim 1, wherein the changing unit continuously changes at least one of the value of the writing start voltage and the increase width of the writing voltage in the writing process in accordance with the monitored characteristic of the non-volatile memory device.

6. The memory system according to claim 5, wherein the changing unit includes:

a calculation unit which calculates a change amount of at least one of the value of the writing start voltage and the increase width of the writing voltage in accordance with the monitored characteristic of the non-volatile memory device, and a changing processing unit which changes at least one of the value of the writing start voltage and the increase width of the writing voltage in the writing process by means of the calculated change amount.

7. The memory system according to claim 1, wherein the changing unit changes the value of the writing start voltage in the writing process in accordance with the monitored characteristic of the non-volatile memory device.

8. The memory system according to claim 1, wherein the changing unit changes the increase width of the writing voltage in the writing process in accordance with the monitored characteristic of the non-volatile memory device.

9. The memory system according to claim 1, wherein the changing unit changes both the value of the writing start voltage and the increase width of the writing voltage in accordance with the monitored characteristic of the non-volatile memory device.

10. The memory system according to claim 1, wherein the changing unit further changes a verification voltage in the writing process in accordance with the monitored characteristic of the non-volatile memory device.

11. A memory system comprising:

a non-volatile memory device including a plurality of memory cells each of which stores data;

a monitoring unit which monitors a characteristic of the non-volatile memory device when writing and erasing processes are performed to write and erase the data to and from the non-volatile memory device; and a changing unit which changes at least a value of an erasing start voltage in the erasing process in accordance with the monitored characteristic, wherein the memory system applies, when performing a writing operation in a writing process where the writing operation and a verification operation are alternately repeated, a first voltage to a first bit line connected to a first write memory cell, a second voltage higher than the first voltage to a second bit line connected to a second write memory cell, a third voltage higher than the second voltage to a third bit line connected to a non-write memory cell, according to a result of the verification operation, and the changing unit changes the second voltage according to the monitored characteristic of the non-volatile memory device.

12. The memory system according to claim 11, wherein the changing unit gradually changes at least the value of the erasing start voltage in the erasing process in accordance with the monitored characteristic of the non-volatile memory device.

13. The memory system according to claim 12, wherein the monitoring unit determines a variation in the monitored characteristic of the non-volatile memory device, and wherein the changing unit gradually changes at least the value of the erasing start voltage in the erasing process, based on a result determined by the monitoring unit.

14. The memory system according to claim 11, wherein the changing unit changes both the value of the erasing start voltage and the increase width of the erasing voltage in the erasing process in accordance with the monitored characteristic of the non-volatile memory device.

15. A memory system comprising:

a non-volatile memory device including a plurality of memory cells each of which stores data;

a monitoring unit which monitors a characteristic of the non-volatile memory device when writing and erasing processes are performed to write and erase the data to and from the non-volatile memory device; and a changing unit which changes a type of verification operation in the writing process from a first type of verification operation to a second type of verification operation in accordance with the monitored characteristic, the writing process being a process in which a writing operation and a verification operation are alternately repeated, the first type of verification operation being a operation where a verification is performed at a second verification voltage, the second type of verification operation being a operation where a verification is performed in two steps at a first verification voltage and at the second verification voltage, the first verification voltage being lower than the second verification voltage, wherein the memory system applies, when performing the writing operation, a first voltage to a first bit line connected to a first write memory cell, a second voltage higher than the first voltage to a second bit line connected to a second write memory cell, a third voltage higher than the second voltage to a third bit line connected to a non-write memory cell, according to a result of the verification operation, and the changing unit changes the second voltage according to the monitored characteristic of the non-volatile memory device.

16. The memory system according to claim 15, wherein the changing unit changes at least one of a level of the first verification voltage and a charging voltage of a bit line in the second type of verification operation in accordance with the monitored characteristic of the non-volatile memory device.

17. The memory system according to claim 16, wherein the changing unit gradually changes at least one of the level of the first verification voltage and the charging voltage of the bit line in the second type of verification operation in accordance with the monitored characteristic of the non-volatile memory device.

18. The memory system according to claim 16, wherein the changing unit changes the level of the first verification voltage in the second type of verification operation in accordance with the monitored characteristic of the non-volatile memory device.

19. The memory system according to claim 16, wherein the changing unit changes the charging voltage of the bit line in the second type of verification operation in accordance with the monitored characteristic of the non-volatile memory device.

20. The memory system according to claim 16, wherein the changing unit changes both the level of the first verification voltage and the charging voltage of the bit line in the second type of verification operation in accordance with the monitored characteristic of the non-volatile memory device.

* * * * *